United States Patent
Kitaoka et al.

(10) Patent No.: US 7,435,295 B2
(45) Date of Patent: Oct. 14, 2008

(54) METHOD FOR PRODUCING COMPOUND SINGLE CRYSTAL AND PRODUCTION APPARATUS FOR USE THEREIN

(75) Inventors: Yasuo Kitaoka, Osaka (JP); Hisashi Minemoto, Osaka (JP); Isao Kidoguchi, Hyogo (JP); Yasuhito Takahashi, Osaka (JP); Takatomo Sasaki, Osaka (JP); Yusuke Mori, c/o Graduate School of Engineering Osaka University, 2-1, Yamadaoka, Suita-shi, Osaka (JP) 565-0871; Fumio Kawamura, Osaka (JP)

(73) Assignees: Matsushita Electric Industrial Co., Ltd., Osaka (JP); Yusuke Mori, Osaka (JP)

( * ) Notice: Subject to any disclaimer, the term of this patent is extended or adjusted under 35 U.S.C. 154(b) by 57 days.

(21) Appl. No.: 10/598,095

(22) PCT Filed: Feb. 18, 2005

(86) PCT No.: PCT/JP2005/002560
§ 371 (c)(1),
(2), (4) Date: Aug. 17, 2006

(87) PCT Pub. No.: WO2005/080648
PCT Pub. Date: Sep. 1, 2005

(65) Prior Publication Data
US 2007/0215035 A1    Sep. 20, 2007

(30) Foreign Application Priority Data
Feb. 19, 2004    (JP)    ............... 2004-043333

(51) Int. Cl.
*C30B 25/12*    (2006.01)
(52) U.S. Cl. ............... 117/64; 117/72; 117/204
(58) Field of Classification Search ............... 117/64, 117/72, 204
See application file for complete search history.

(56) References Cited

U.S. PATENT DOCUMENTS
2004/0183090 A1    9/2004 Kitaoka et al.

FOREIGN PATENT DOCUMENTS
JP    1-116013    5/1989
(Continued)

OTHER PUBLICATIONS

The Society of Chemical Engineers, Japan, "Kagaku Kogaku Binran", vol. 6, 1999, pp. 426-427.
Kawamura, et al., "Growth of Transparent, Large Size GaN Single Crystal with Low Dislocations using Ca-Na Flux System", Jpn. J. Appl. Phys., vol. 42.

*Primary Examiner*—Felisa C Hiteshew
(74) *Attorney, Agent, or Firm*—Hamre, Schumann, Mueller & Larson, P.C.

(57) ABSTRACT

The present invention provides a method for producing a compound single crystal that can improve a growth rate and grow a large single crystal with high crystal uniformity in a short time, and a production apparatus used for the method. The compound single crystal is grown while stirring a material solution to create a flow from a gas-liquid interface in contact with a source gas toward the inside of the material solution. With this stirring, the source gas can be dissolved easily in the material solution, and supersaturation can be achieved in a short time, thus improving the growth rate of the compound single crystal. Moreover, the flow formed by the stirring goes from the gas-liquid interface where a source gas concentration is high to the inside of the material solution where the source gas concentration is low, so that dissolution of the source gas becomes uniform. Accordingly, it is possible not only to suppress nonuniform nucleation at the gas-liquid interface, but also to improve the quality of the compound single crystal produced.

32 Claims, 14 Drawing Sheets

FOREIGN PATENT DOCUMENTS

| | | |
|---|---|---|
| JP | 2000-327495 | 11/2000 |
| JP | 2002-293696 | 10/2002 |
| JP | 2004-300024 | 10/2004 |
| JP | 2005-12171 | 1/2005 |
| JP | 2008-501600 | 1/2008 |
| WO | 2005/121415 | 12/2005 |

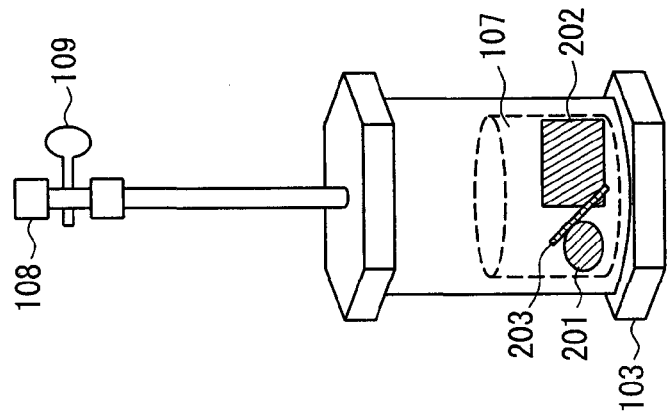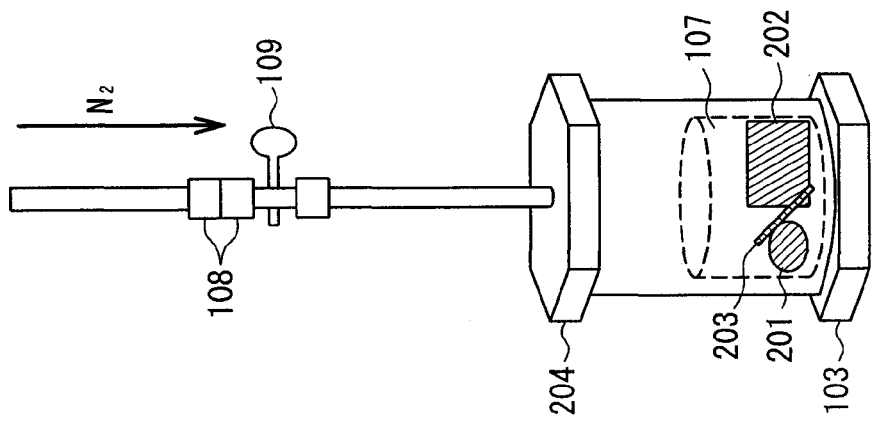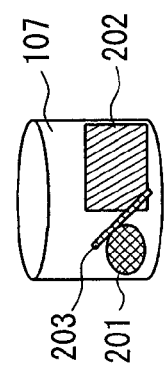
FIG. 2C
FIG. 2B
FIG. 2A

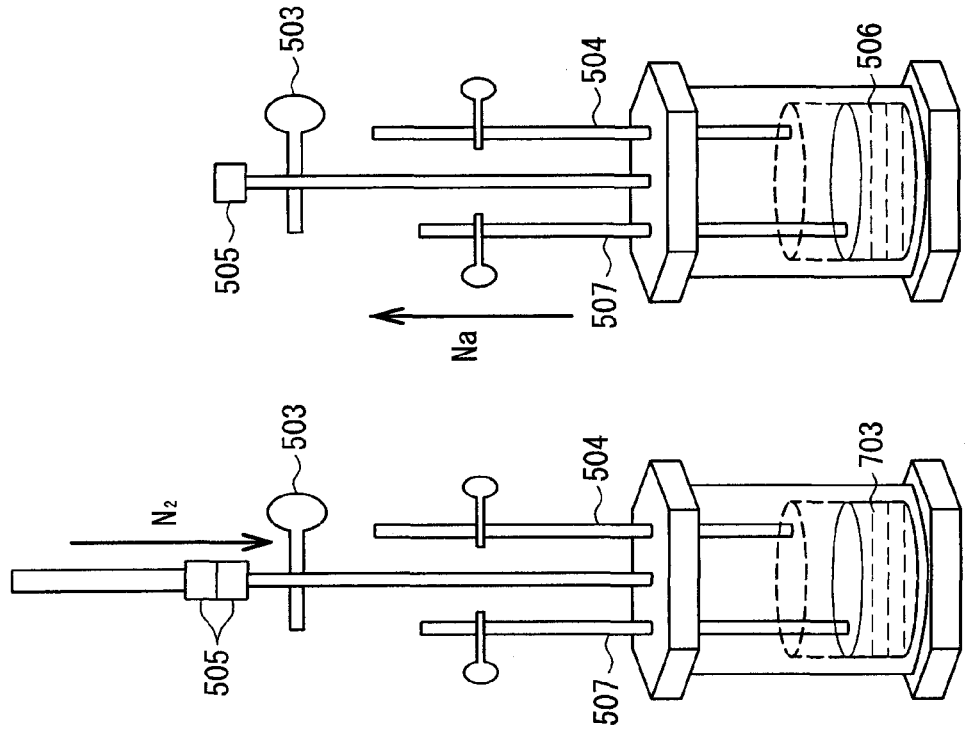
FIG. 7D
FIG. 7C
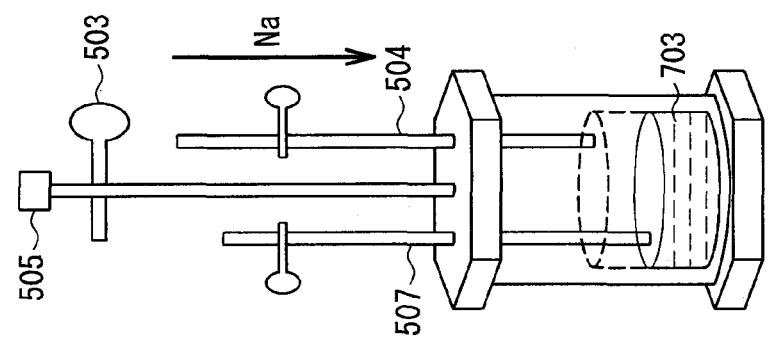
FIG. 7B
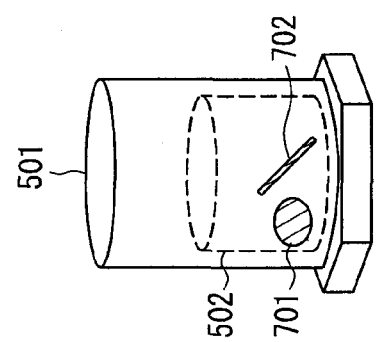
FIG. 7A

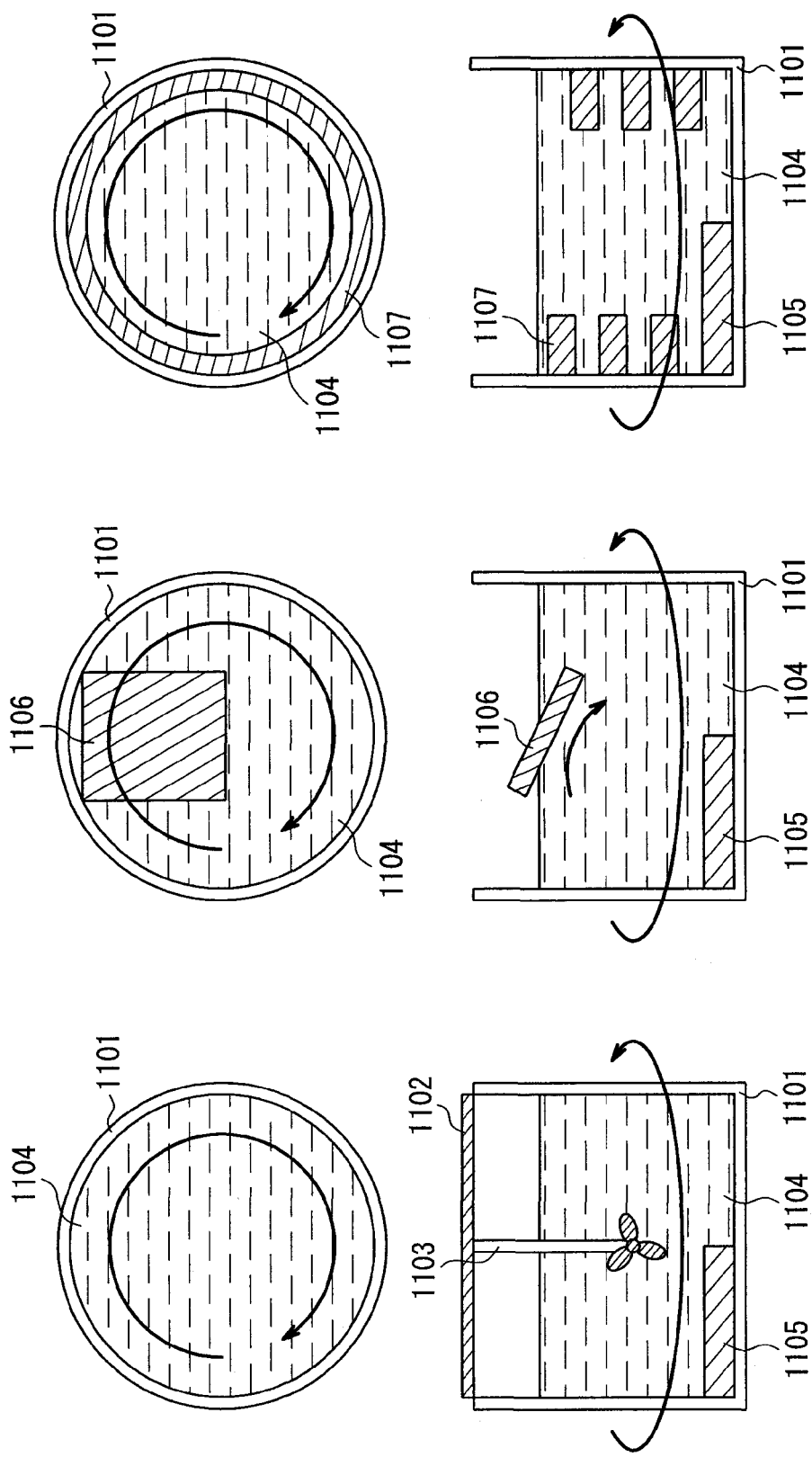

METHOD FOR PRODUCING COMPOUND SINGLE CRYSTAL AND PRODUCTION APPARATUS FOR USE THEREIN

TECHNICAL FIELD

The present invention relates to a method for producing a compound single crystal and a production apparatus used for the method. In particular, the present invention relates to a method for producing a Group III nitride single crystal such as gallium nitride or aluminum nitride and a production apparatus used for the method.

BACKGROUND ART

A Group III nitride compound semiconductor such as gallium nitride (GaN), which may be referred to as a "Group III nitride semiconductor" or "GaN semiconductor" in the following, has attracted attention as a material for a semiconductor device that emits blue or ultraviolet light. A blue laser diode (LD) is applied to a high-density optical disk or display, and a blue light-emitting diode (LED) is applied to a display or lighting. An ultraviolet LD is expected to be used in biotechnology, and an ultraviolet LED is expected to be used as an ultraviolet source of a fluorescent lamp.

A substrate of the Group III nitride semiconductor (e.g., GaN) for a LD or LED is formed generally by the heteroepitaxial growth of a Group III nitride single crystal on a sapphire substrate by vapor phase epitaxy. Examples of the vapor phase epitaxy include metal organic chemical vapor deposition (MOCVD), hydride vapor phase epitaxy (HVPE), and molecular beam epitaxy (MBE).

On the other hand, a method using liquid phase epitaxy instead of vapor phase epitaxy also has been studied. The equilibrium vapor pressure of nitrogen at the melting point of the Group III nitride single crystal such as GaN or AlN is 10,000 atm or more. Therefore, conventional liquid phase epitaxy of GaN has required the conditions of 8000 atm ($8000 \times 1.01325 \times 10^5$ Pa) at 1200° C. (1473 K). In recent years, however, it has become clear that GaN can be synthesized at a relatively low temperature and pressure, i.e., 750° C. (1023 K) and 50 atm ($60 \times 1.01325 \times 10^5$ Pa) by using an alkali metal (e.g., Na) as a flux.

For example, JP 2002-293696 A (Patent Document 1) discloses a method in which a mixture of Ga and Na is melted at 800° C. (1073 K) and 50 atm ($60 \times 1.01325 \times 10^5$ Pa) in a nitrogen gas atmosphere containing ammonia, and a single crystal is grown from this melt (material solution) for 96 hours. The single crystal thus obtained has a maximum crystal size of about 1.2 mm.

Another method also has been reported in which a GaN crystal layer is deposited on a sapphire substrate by metal organic chemical vapor deposition (MOCVD), and then a single crystal is grown by liquid phase epitaxy (LPE).

The liquid phase epitaxy of a GaN crystal using an alkali metal (e.g., Na) as a flux will be described below. FIG. 8 is a schematic view showing the configuration of a growth apparatus. The growth apparatus includes a source gas supply unit 801 for supplying a nitrogen gas (source gas), a pressure regulator 802 for regulating the pressure of a growth atmosphere, a reactor (stainless steel container) 803 for crystal growth, and a heating unit (electric furnace) 804. A crucible 805 is set in the stainless steel container 803. A connection pipe 806 through which the source gas flows from the source gas supply unit 801 to the stainless steel container 803 is made of a SUS material. The crucible 805 is made of alumina ($Al_2O_3$). The temperature of the electric furnace 804 can be controlled at 600° C. (873 K) to 1100° C. (1373 K). The ambient pressure can be controlled at 100 atm ($100 \times 1.01325 \times 10^5$ Pa) or less by the pressure regulator 802. In FIG. 8, reference numeral 807 denotes a stop valve, and 808 denotes a leak valve.

Na (flux) and metal gallium (material) are weighed out in a predetermined amount and placed in the crucible 805. Moreover, a substrate obtained by growing GaN on a sapphire substrate with MOCVD is put in the crucible 805 as a seed crystal. The crucible 805 is inserted in the stainless steel container 803. Then, the stainless steel container 803 is set in the electric furnace 804 and connected to the connection pipe 806, which is connected to the source gas supply unit 801. The growth temperature is 850° C. (1123 K) and the nitrogen ambient pressure is 30 atm ($30 \times 1.01325 \times 10^5$ Pa). A GaN single crystal is grown by maintaining the growth temperature for 30 hours and 96 hours, respectively. In a growth time of 30 hours, the GaN single crystal has a thickness of 50 μm. In a growth time of 96 hours, the GaN single crystal has a thickness of 700 μm.

This result shows that in the current growth apparatus, it takes about 20 to 30 hours to dissolve nitrogen in a Ga/Na melt (material solution) until the solution is supersaturated. The growth rate in the thickness direction (C-axis direction) is about 10 μm/hour.

However, further improvements in growth rate and quality are being demanded in the field of a Group III nitride single crystal including GaN.

Patent Document 1: JP 2002-293696 A

DISCLOSURE OF INVENTION

Problem to be Solved by the Invention

To improve the growth rate, the source gas needs to be dissolved efficiently in the material solution (which may include a flux material). However, in the conventional liquid phase epitaxy of a nitride semiconductor single crystal that uses, e.g., an alkali metal (Na) or alkaline-earth metal as a flux, the source gas (nitrogen) is dissolved in the material solution under pressure. Therefore, nonuniform nucleation is likely to occur at a gas-liquid interface. When the nucleation occurs at the gas-liquid interface, crystal growth that should be performed on the seed crystal is suppressed, resulting in a low growth rate.

Therefore, it is an object of the present invention to provide a method for producing a compound single crystal that can improve a growth rate and grow a large single crystal with high crystal uniformity in a short time, and a production apparatus used for the method.

Means for Solving Problem

A method for producing a compound single crystal of the present invention includes growing a compound single crystal by reacting a source material with a material solution. The single crystal is grown while stirring the material solution to create a flow from a gas-liquid interface in contact with the source gas toward the inside of the material solution.

Effects of the Invention

The present inventors conducted a series of studies on the growth of a compound single crystal. During the process, the present inventors found that it was important for single crystal growth to dissolve a source gas in a material solution to cause supersaturation, and also to suppress nonuniform nucleation at a gas-liquid interface. These were factors in improving the crystal growth rate. Therefore, as described above, the present invention has succeeded in stirring the material solution to create a flow from the gas-liquid interface in contact with the source gas toward the inside of the material solution. With this stirring, the source gas can be dissolved easily in the material solution, and supersaturation can be achieved in a short time, thus improving the growth rate of a compound single crystal. Moreover, the flow formed by the stirring goes from the gas-liquid interface where a source gas concentration is high to the inside of the material solution where the source gas concentration is low, so that dissolution of the source gas becomes more uniform. Accordingly, it is possible not only to suppress nonuniform nucleation at the gas-liquid interface, but also to improve the quality of the compound single crystal produced.

BRIEF DESCRIPTION OF DRAWINGS

FIGS. 2A to 2C are schematic views showing an example of the processes of a production method of the present invention. FIG. 2A shows an example of placing materials in a crucible. FIG. 2B shows an example in which the crucible is inserted in a closed pressure- and heat-resistant container, and nitrogen is introduced into the closed pressure- and heat-resistant container. FIG. 2C shows an example of sealing the closed pressure- and heat-resistant container.

FIG. 6A shows an example of dissolving materials before stirring. FIGS. 6B to 6D show an example of stirring a material solution.

FIGS. 7A to 7D are schematic views showing another example of the processes of a production method of the present invention. FIG. 7A shows another example of placing materials in a crucible. FIG. 7B shows an example of injecting a liquid flux material. FIG. 7C shows another example of introducing nitrogen. FIG. 7D shows an example of drawing a material solution.

FIG. 9A shows an example of sheet templates in a crucible during a growth process. FIG. 9B shows an example of the sheet templates in the crucible after the growth process, followed by cooling a material solution.

FIG. 10A is a side view showing an example in which a plurality of sheet templates are placed substantially upright on the bottom of a crucible, as viewed from the side of the sheet templates. FIGS. 10B to 10D are front views showing an example of stirring a material solution, as viewed from the front of the sheet templates.

FIGS. 11A to 11C are schematic views showing another example of a stirring process of a material solution of the present invention. FIG. 11A shows an example of stirring with an impeller. FIG. 11B shows an example of stirring with a baffle. FIG. 11C shows an example of stirring with helical protrusions formed on the inner wall of a crucible.

DESCRIPTION OF REFERENCE NUMERALS

Figure 1:
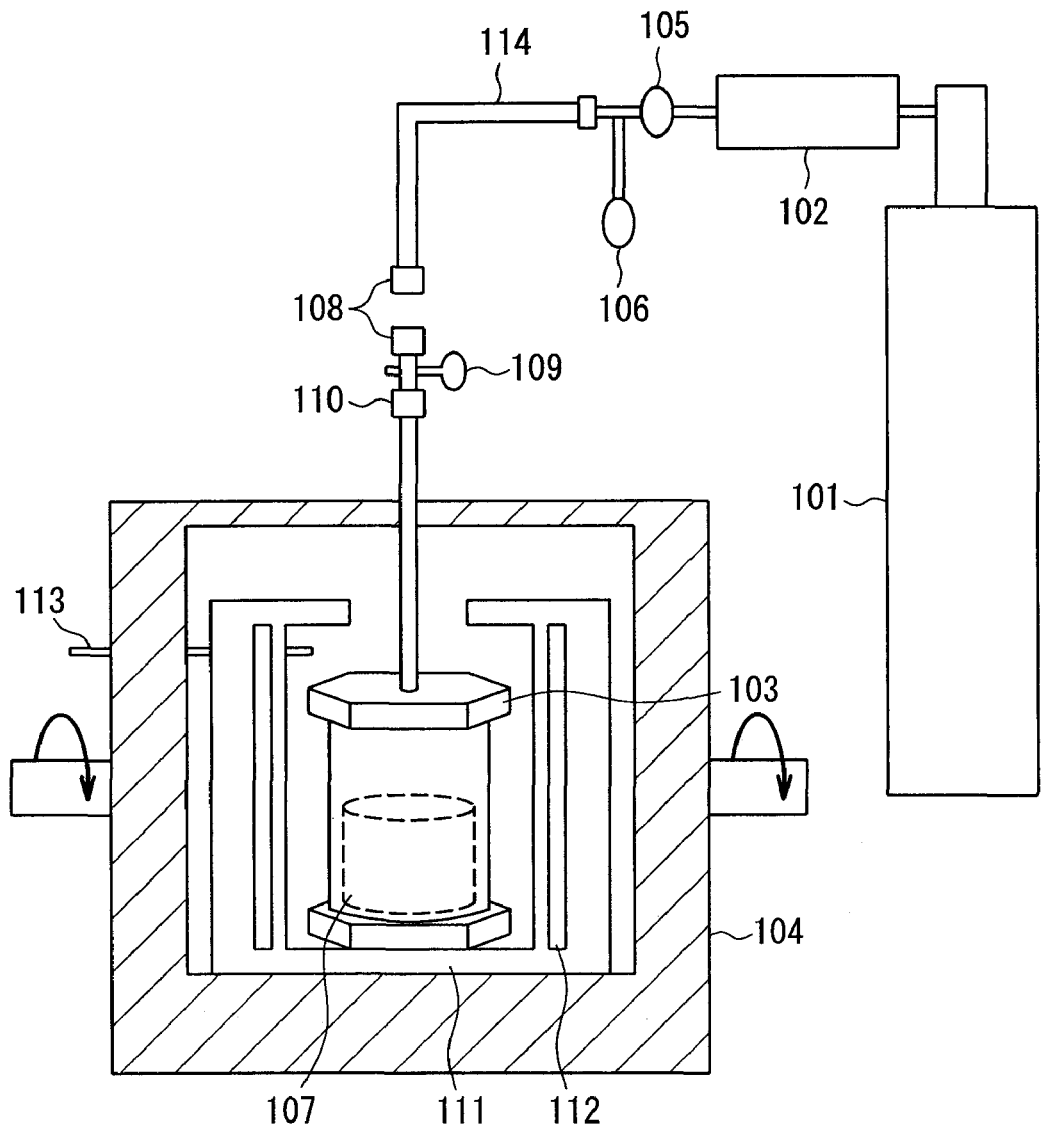
FIG. 1 is a schematic view showing an example of the configuration of a production apparatus of the present invention.

101, 405, 801 Source gas supply unit
102, 318, 407, 802 Pressure regulator
103, 305, 401, 501, 803 Closed pressure- and heat-resistant container
104, 309, 406, 508, 804 Growth chamber
105, 109, 307, 403, 409, 503, 807 Stop valve
106, 410, 808 Leak valve
107, 306, 402, 502, 601, 805, 901, 1001, 1101 Crucible
108, 313, 505 Detachable portion
110, 308, 404 Connection portion
111, 310, 411, 509 Heat insulator
112, 311, 412, 510 Heater
113, 312, 413, 511 Thermocouple
114, 806 Connection pipe
115, 205, 315, 414 Connection pipe
201, 701 Group III element
202 Alkali metal
203, 603, 702, 902, 1003, 1105 Template
204 Lid
314 Rotational mechanism
316 Rotational mechanism under a closed pressure- and heat-resistant container
317 Auxiliary tank system
318 Corrugated plate
408 Flexible pipe
504 Injection pipe
506, 602, 903, 1002, 1104 Material solution
507 Extraction pipe
703 Flux material
1102 Lid
1103 Impeller
1106 Baffle
1007 Helical protrusions

BEST MODE FOR CARRYING OUT THE INVENTION

The production method of the present invention may use a single crystal production apparatus including a heating unit and a closed pressure- and heat-resistant container that is heated inside the heating unit. The source gas of the compound single crystal and other materials are provided to the container and sealed in a pressurized atmosphere. The container is housed in the heating unit. A material solution is prepared by heating the container in the heating unit so that the other materials melt into a liquid. Under these conditions, a single crystal is grown by reacting the source gas with the material solution while the material solution is stirred. Even if the closed pressure- and heat-resistant container is not connected to the source gas supply unit by a connection pipe, the container can hold the source gas and the other materials in the pressurized atmosphere because of its sealing properties.

Figure 8:
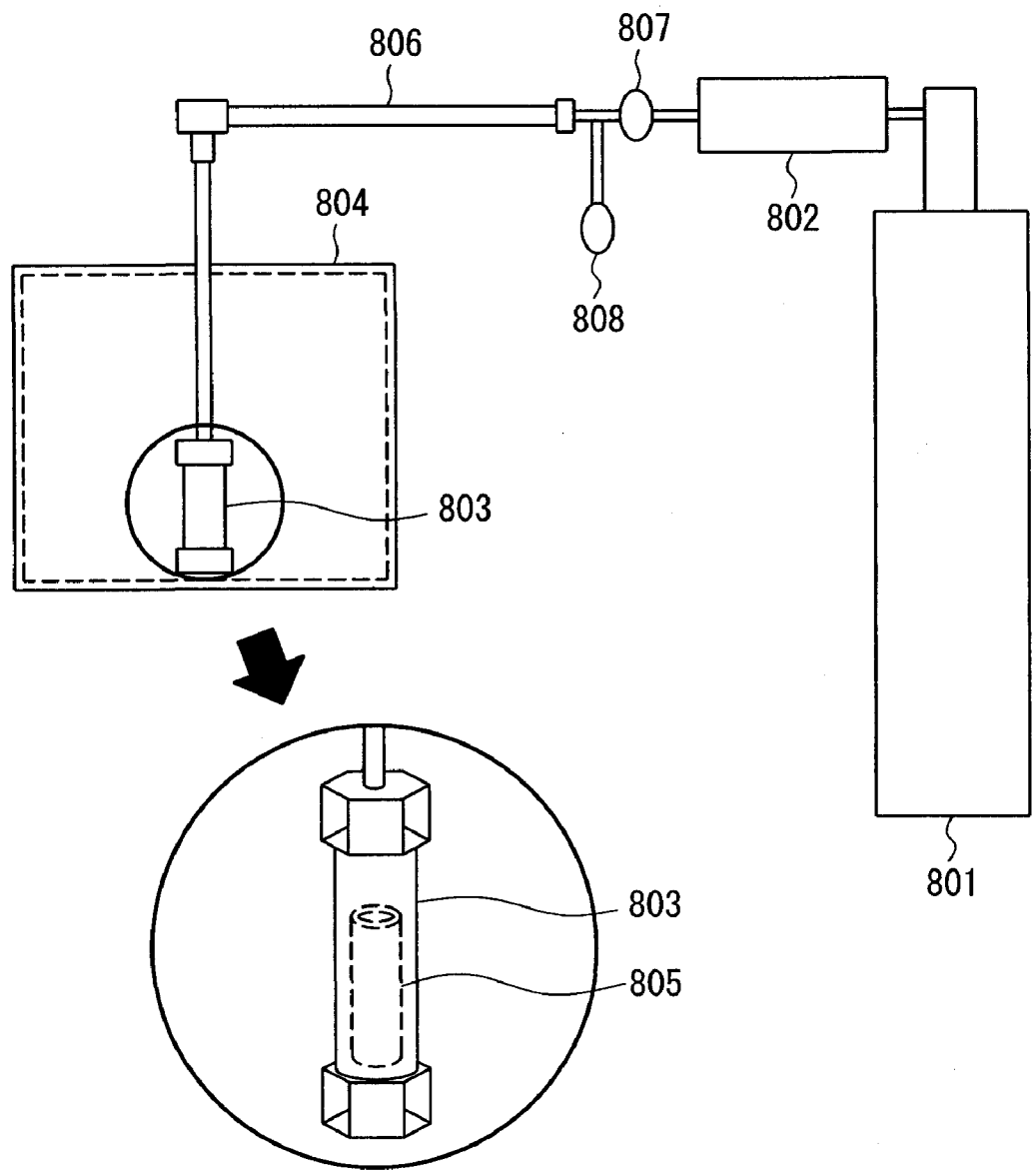
FIG. 8 is a schematic view showing an example of the configuration of a conventional production apparatus.

Therefore, the container can be separated from the connection pipe and rocked to stir the material solution freely. In contrast, it is structurally difficult to stir the material solution in the conventional crystal growth apparatus. As shown in FIG. 8, the source gas supply unit 801 and the stainless steel container 803 are connected by the connection pipe 806 made of a SUS material, and the stainless steel container 803 is fixed. In the present invention, the closed pressure- and heat-resistant container may be rocked without being separated from the connection pipe, e.g., by using a means such as a flexible pipe, which will be described later.

In the production method of the present invention, it is preferable that the single crystal is grown by reacting the source gas with the material solution while the material solution is stirred by rocking the container.

In the production method of the present invention, it is preferable that the container is rocked by rocking the heating unit.

In the production method of the present invention, it is preferable that a crucible is set in the container, and at least one of the inside and the inner wall of the crucible has at least one selected from the group consisting of (A) impeller, (B) baffle, (C) template, and (D) helical protrusions. An example of the template will be described later.

In the production method of the present invention, the rocking may be a shift motion, a linear repetitive motion, a pendular motion, a rotational motion, or a combined motion of any of these motions. For example, when the linear repetitive motion and the rotational motion are combined, and the material solution is stirred to create a flow from the gas-liquid interface to the inside of the material solution, the flow goes from the gas-liquid interface where the source gas concentration is high to the inside of the material solution where the source gas concentration is low. This can suppress nonuniform nucleation on the inner wall of the closed pressure- and heat-resistant container, and thus can achieve a large growth rate.

In the production method of the present invention, it is preferable that the other materials include a flux material.

In the production method of the present invention, the single crystal production apparatus further may include a source gas supply unit. It is preferable that the source gas supply unit is connected to the container in which the other materials have been put, supplies the source gas to the container, and is separated from the container after supplying the source gas, and subsequently the container is rocked.

In the production method of the present invention, it is preferable that the source gas supply unit is separated from the container after heating the container so that the other materials melt into a liquid and adjusting the pressure in the container.

In the production method of the present invention, it is preferable that the pressure of the source gas in the container is reduced after the formation of the single crystal.

In the production method of the present invention, the single crystal production apparatus further may include an auxiliary tank system for supplying the source gas, and the auxiliary tank system may be connected to the container.

In the production method of the present invention, the single crystal production apparatus further may include a source gas supply unit. The source gas supply unit and the container may be connected by a flexible pipe, and the container may be rocked without being separated from the source gas supply unit. In the case of a flexible pipe, another production method of the present invention may use a single crystal production apparatus including a heating unit and a closed pressure- and heat-resistant container that is heated inside the heating unit, a source gas supply unit, and a flexible pipe. The source gas of the compound single crystal and other materials are provided to the container. The container is housed in the heating unit. The source gas supply unit and the container are connected by the flexible pipe. The container is heated by the heating unit so that the other materials melt into a liquid. Under these conditions, a single crystal is grown by reacting the source gas with the material solution. The decision whether to separate the container from the source gas supply unit can be made arbitrarily. As described above, the container may be rocked without being separated from the source gas supply unit. Alternatively, the container may be rocked after being separated from the source gas supply unit and sealed. It is further preferable to rock the container without being separated from the source gas supply unit, since crystal growth can be performed stably while maintaining the pressure in the container constant by a pressure regulator, and thus a specific growth orientation and growth rate can be achieved.

In the production method of the present invention, it is preferable that the source gas includes at least one of nitrogen and ammonia, the other materials include a Group III element (gallium, aluminum, or indium) and a flux material, and the single crystal formed in the material solution is a Group III nitride single crystal. The Group III elements can be used either individually or in combinations of two or more.

In the production method of the present invention, it is preferable that the flux material includes at least one of an alkali metal and alkaline-earth metal. In a conventional production method, e.g., when the growth temperature is 700° C. (973 K) or more, the vapor pressure of the alkali metal or alkaline-earth metal is increased. Therefore, a temperature distribution develops in the reactor and may cause aggregation of the material solution. This leads to a change in the flux ratio of the material solution and significantly affects the crystal growth. Moreover, the reactor is located in a high-temperature region of the heating unit, where the magnetic force disappears. Therefore, even if the reactor is provided with a motor for stirring, it is difficult to stir the material solution. In contrast, the production method of the present invention poses no problem in using the alkali metal or alkaline-earth metal because the material solution can be stirred. The alkali metal may be, e.g., sodium, lithium, or potassium. The alkaline-earth metal may be, e.g., Ca, Mg, Sr, Ba, or Be. These alkali metals and alkaline-earth metals can be used either individually or in combinations of two or more.

In the production method of the present invention, it is preferable that a template that comprises a semiconductor layer expressed as a composition formula: $Al_uGa_vIn_{1-u-v}N$ ($0 \leq u \leq 1$, $0 \leq v \leq 1$, and $0 \leq u+v \leq 1$) is placed in the container beforehand.

In the production method of the present invention, it is preferable that the material solution is prepared by heating in the container, the source gas is dissolved in the material solution, and subsequently the template is immersed in the material solution.

In the production method of the present invention, it is preferable that a crucible is set in the container, and the template is a sheet template and placed substantially upright on the bottom of the crucible. In the case of a sheet template, yet another production method of the present invention may use a single crystal production apparatus including a heating unit and a closed pressure- and heat-resistant container that is heated inside the heating unit. A crucible is set in the container. A sheet template is placed substantially upright on the bottom of the crucible. The source gas of the compound single crystal and other materials are put in the crucible. The container along with the crucible is housed in the heating unit.

The container is heated by the heating unit so that the other materials melt into a liquid. Under these conditions, a single crystal is grown by reacting the source gas with the material solution. In this method, a single sheet template one or more than one (e.g., 2 to 10) may be used. The sheet template stands substantially upright and also can slope slightly.

In the production method of the present invention, it is preferable that the container is rocked so that the material solution moves parallel to the sheet template.

In the production method of the present invention, it is preferable that at least the flux material is removed from the container after the growth of the compound single crystal is finished. In the case of removal of the flux material, still another production method of the present invention may use a single crystal production apparatus including a heating unit and a closed pressure- and heat-resistant container that is heated inside the heating unit. The source gas of the compound single crystal and other materials are provided to the container. The container is housed in the heating unit. The container is heated by the heating unit so that the other materials melt into a liquid. Under these conditions, a single crystal is grown by reacting the source gas with the material solution. After the growth of the compound single crystal is finished, at least the flux material is removed from the container.

In the production method of the present invention, the material solution may include at least gallium and sodium. The heating temperature of the material solution may be 100° C. (373 K) or more, preferably 300° C. (573 K) or more, and further preferably 500° C. (773 K) or more.

In the production method of the present invention, the growth rate of the Group III nitride single crystal may be 30 μm/hour or more, preferably 50 μm/hour or more, and further preferably 100 μm/hour or more.

In the production method of the present invention, it is preferable that the pressure of the source gas in the container is 5 atm ($5\times1.01325\times10^5$ Pa) to 1000 atm ($1000\times1.01325\times10^5$ Pa). The amount of the source gas dissolved in the material solution can be increased by the application of pressure.

In the production method of the present invention, it is preferable that the heating unit is filled with an inert gas.

In the production method of the present invention, when the other materials include gallium, the following formula (1) may be satisfied, preferably the following formula (2), and further preferably the following formula (3):

$$V\times(P/1.01325\times10^5)\times(T1/T)>(X/2a)\times22.4\times2 \quad (1)$$

$$V\times(P/1.01325\times10^5)\times(T1/T)>(X/2a)\times22.4\times5 \quad (2)$$

$$V\times(P/1.01325\times10^5)\times(T1/T)>(X/2a)\times22.4\times10 \quad (3)$$

where X (g) is the weight of gallium to be consumed, a (=69.723) is the atomic weight of gallium, V (liter) is the internal volume of the container, P (Pa) is the ambient pressure during the growth process (formation of the single crystal), T (K) is the growth temperature, and T1 (K) is a temperature at which the other materials are weighed.

In the production method of the present invention, it is preferable that the single crystal production apparatus includes a pipe for connecting the container in the heating unit and the outside of the heating unit, and the pipe has a structure that is likely to prevent aggregation of at least one of the material solution and the other materials. The pipe may be, e.g., a connection pipe between the container and the source gas supply unit, the flexible pipe, or a connection pipe between the container and the auxiliary tank system.

In the production method of the present invention, the inner diameter of the pipe may be 3 mm or less, and preferably 2 mm or less.

A single crystal production apparatus of the present invention is used for the production method of the present invention and includes a closed pressure- and heat-resistant container, a heating unit for housing the container, and a rocking unit for rocking the container.

In the production apparatus of the present invention, it is preferable that the container is rocked with the heating unit.

In the production apparatus of the present invention, the rocking may be a shift motion, a linear repetitive motion, a pendular motion, a rotational motion, or a combined motion of any of these motions.

In the production apparatus of the present invention, it is preferable that a crucible is set in the container, and at least one of the inside and the inner wall of the crucible has at least one selected from the group consisting of (A) impeller, (B) baffle, (C) template, and (D) helical protrusions. An example of the template will be described later.

In the production apparatus of the present invention, it is preferable that the container is housed in the heating unit to maintain a constant temperature. When the material solution includes the alkali metal or alkaline-earth metal and the growth temperature is 700° C. (973 K) or more, the vapor pressure of the alkali metal or alkaline-earth metal is increased. Therefore, a temperature distribution develops in the container and may cause aggregation of the material solution, which significantly affects the crystal growth.

The production apparatus of the present invention further may include a source gas supply unit.

In the production apparatus of the present invention, it is preferable that the container and the source gas supply unit are connected and separated freely.

The production apparatus of the present invention further may include a flexible pipe, and the container and the source gas supply unit may be connected by the flexible pipe.

The production apparatus of the present invention further may include an auxiliary tank system for supplying the source gas, and the auxiliary tank system may be connected to the container.

Next, a method for producing a Group III nitride single crystal will be described as an example of the production method of the present invention.

In the method for producing a Group III nitride single crystal of the present invention, e.g., the Group III nitride single crystal is grown by reacting a material solution that includes a Group III element (gallium, aluminum, or indium) and an alkali metal with nitrogen in a nitrogen-containing atmosphere (preferably a pressurized atmosphere of 1000 atm ($1000\times1.01325\times10^5$ Pa) or less). As described above, the Group III elements can be used either individually or in combinations of two or more. The alkali metal also has been mentioned already. The nitrogen-containing atmosphere may be, e.g., a nitrogen gas atmosphere or nitrogen gas atmosphere containing ammonia.

Embodiment 1

In this embodiment, a closed pressure- and heat-resistant container can be separated from a connection pipe, and the container is rocked with a heating unit. An example of a production apparatus of this embodiment and an example of a production method using the apparatus will be described in the following.

The production apparatus includes a source gas supply unit for supplying a source gas, a pressure regulator for regulating the pressure of a growth atmosphere, a closed pressure- and heat-resistant container for crystal growth, a heating unit, and a rocking unit for rocking the whole heating unit. The source gas may be a gas containing nitrogen or ammonia. The closed pressure- and heat-resistant container may be made of a SUS material such as SUS316 or a material that resists high temperatures and high pressures such as Inconel, Hastelloy, or Incoloy. In particular, Inconel, Hastelloy, or Incoloy is preferred in terms of recycling and durability because they also resist oxidation under elevated temperatures and pressures and can be used even in an atmosphere other than an inert gas. A crucible is set in the closed pressure- and heat-resistant container. The crucible may be made of alumina ($Al_2O_3$), BN, PBN, MgO, CaO, or W. The heating unit may be an electric furnace including a heat insulator and a heater. The heating unit is housed in a growth chamber, and the temperature may be controlled with a thermocouple or the like. In particular, the temperature of the heating unit may be controlled so that the temperature of the closed pressure- and heat-resistant container is maintained constant to prevent aggregation of a material solution (which may include a flux material).

The temperature inside the heating unit (growth chamber) can be controlled, e.g., at 600° C. (873 K) to 1100° C. (1373 K). The ambient pressure can be controlled, e.g., at 1000 atm ($1000 \times 1.01325 \times 10^5$ Pa) or less by the pressure regulator. Since the closed pressure- and heat-resistant container is detachable freely, the container is fixed in the heating unit (growth chamber), and the whole heating unit (growth chamber) can be rocked.

An alkali metal (flux) and a Group III element are placed in the crucible, and the closed pressure- and heat-resistant container is filled with a reactant gas containing nitrogen, so that a Group III nitride single crystal can be produced by liquid phase epitaxy. In the nitrogen-containing atmosphere under pressure, the Group III nitride single crystal is grown by dissolving nitrogen in the material solution that includes the Group III element (gallium, aluminum or indium) and the alkali metal. The material solution further may include an alkaline-earth metal. As described above, the Group III elements can be used either individually or in combinations of two or more. The alkali metal and the alkaline-earth metal also have been mentioned already. When the material solution includes the alkali metal or alkaline-earth metal, the vapor pressure is increased at a high temperature of 700° C. (973 K) or more. Therefore, a temperature distribution develops in the closed pressure- and heat-resistant container and may cause aggregation of the material solution. For example, the vapor pressure of sodium is 300 Torr ($300 \times 133.322$ Pa) at 800° C. (1073 K). The material solution including sodium hardly is aggregated if the temperature distribution is 10° C. (10 K) or less. However, the aggregation is observed if it is 20° C. (20 K) or more, and most of the material solution is aggregated in a low-temperature region if it is 50° C. (60 K) or more. Thus, the temperature of the closed pressure- and heat-resistant container should be kept constant.

The material solution is prepared by heating the materials in the crucible. The temperature is controlled, e.g., at 700° C. (973 K) to 1100° C. (1373 K). It is preferable that the source gas containing nitrogen is filled into the closed pressure- and heat-resistant container in a pressurized atmosphere, and the ambient pressure in the container due to the source gas is adjusted after heating. The ambient pressure is controlled, e.g., at about 1 atm ($1 \times 1.01325 \times 10^5$ Pa) to 1000 atm ($1000 \times 1.01325 \times 10^5$ Pa). When the material solution is formed and then supersaturated with nitrogen, a Group III nitride crystal is precipitated.

A template may be put in the crucible. The template may be obtained by depositing a semiconductor layer expressed as a composition formula: $Al_uGa_vIn_{1-u-v}N$ ($0 \leq u \leq 1$, $0 \leq v \leq 1$, and $0 \leq u+v \leq 1$) on a sapphire substrate or the like. Alternatively, the template may be a single crystal expressed as a composition formula: $Al_uGa_vIn_{1-u-v}N$ ($0 \leq u \leq 1$, $0 \leq v \leq 1$, and $0 \leq u+v \leq 1$). When the template is present in the crucible as a seed crystal, a thick single crystal is grown on the template, and thus a substrate with a large area can be provided easily. Although the template may be immersed in the material solution during its formation, it is further preferable that the template is immersed in the material solution in which nitrogen is dissolved to some extent.

Next, an example of a method for producing a Group III nitride single crystal using the production apparatus will be described in detail by referring to FIG. 2.

As shown in FIG. 2A, a Group III element (material) 201, an alkali metal (flux) 202, and a template 203 composed of a sapphire substrate and a semiconductor layer expressed as a composition formula: $Al_uGa_vIn_{1-u-v}N$ ($0 \leq u \leq 1$, $0 \leq v \leq 1$, and $0 \leq u+v \leq 1$) are placed in a crucible 107. It is preferable that the Group III element 201 and the alkali metal 202 are weighed out in a glove box where the gas is replaced with nitrogen so as to avoid oxidation or moisture adsorption of the alkali metal 202. It is further preferable that the gas in the glove box is replaced with Ar or Ne.

As shown in FIG. 2B, the crucible 107 is inserted in a closed pressure- and heat-resistant container 103, which is covered with a lid 204. After closing a stop valve 109, the closed pressure- and heat-resistant container 103 is taken out of the glove box.

Then, the closed pressure- and heat-resistant container 103 is connected to a source gas supply unit (not shown), and the stop valve 109 is opened to allow a source gas into the closed pressure- and heat-resistant container 103. In this case, although not shown in the drawing, it is preferable that the container 103 is evacuated with a rotary pump or the like, and subsequently the source gas is introduced again into the container 103 for substitution.

As shown in FIG. 2C, the stop valve 109 is closed, and a detachable portion 108 is removed, thereby separating the closed pressure- and heat-resistant container 103.

The source gas may be introduced into the container 103 within the glove box. Thereafter, the stop valve 109 is closed, and the detachable portion 108 is removed to separate the container 103. This procedure also can provide a similar effect.

Next, the closed pressure- and heat-resistant container 103 is fixed in the heating unit (growth chamber). Although the conditions of melting the materials and growing a crystal vary depending on the component of the flux or the component and pressure of the atmospheric gas, the growth process is performed, e.g., at a low temperature of 700° C. (973 K) to 1100° C. (1373 K), and preferably 700° C. (973 K) to 900° C. (1173 K). The pressure is 1 atm ($1 \times 1.01325 \times 10^5$ Pa) or more, and preferably 5 atm ($5 \times 1.01325 \times 10^5$ Pa) to 1000 atm ($1000 \times 1.01325 \times 10^5$ Pa). The temperature is raised to the growth temperature at which the material solution is formed in the crucible. The material solution is stirred by rocking the heating unit (growth chamber). Thus, the material solution reacts with the source gas to produce a single crystal of the Group III nitride semiconductor in the closed pressure- and heat-resistant container. When the internal volume of the container is smaller than the amount of the Group III element consumed, the pressure in the container decreases due to the consumption of nitrogen. In such a case, rocking is halted temporarily during the growth process, and the detachable portion 108 is connected to the source gas supply unit again to allow the source gas into the closed pressure- and heat-resistant container, so that the pressure in the container can be adjusted. After removing the detachable portion 108, the growth process is restarted while rocking the heating unit. Thus, it is possible to ensure stable crystal growth.

The heating unit (growth chamber) preferably is filled with an inert gas. The closed pressure- and heat-resistant container is oxidized when held in air at high temperatures, and therefore difficult to be reused. If the container is held in an inert gas such as Ar, $N_2$, He, or Ne, it can be recycled.

The closed pressure- and heat-resistant container 103 is separated at the detachable portion 108 and then fixed in the heating unit (growth chamber). In this case, however, it is difficult to adjust the pressure finely in the container 103. Therefore, the container 103 may be separated at the detachable portion 108 preferably after fixing it in the heating unit (growth chamber), raising the temperature to the growth temperature, and adjusting the pressure.

Referring to FIG. 6, the stirring action of the material solution will be described below. First, as shown in FIG. 6A, the heating unit (growth chamber) is tilted (not shown), so that a crucible 601 fixed in the heating unit also is tilted. While a template 603 is not immersed in a material solution 602, the heating unit (growth chamber) is heated to melt the materials. Then, the desired growth temperature and pressure are set, and the material solution 602 is swayed and stirred by rocking the heating unit (growth chamber) and the crucible 601 from side to side (FIGS. 6B to 6D).

In FIG. 6, the template 603 is fixed at the bottom of the crucible 601. In this case, however, the template 603 is immersed in the material solution 602 in which nitrogen is not dissolved sufficiently. Therefore, the template 603 may be immersed in the material solution 602 preferably after melting the materials and rocking the crucible 601 so that nitrogen is dissolved sufficiently in the material solution 602.

In FIGS. 2 and 6, the template (seed crystal) is located at the bottom of the crucible or a sloping position. It is essential to perform the crystal growth simultaneously on a plurality of templates to provide inexpensive crystal substrates. However, there have been serious problems when a plurality of sheet templates are located diagonally or parallel to the bottom of the crucible.

Figure 9A:
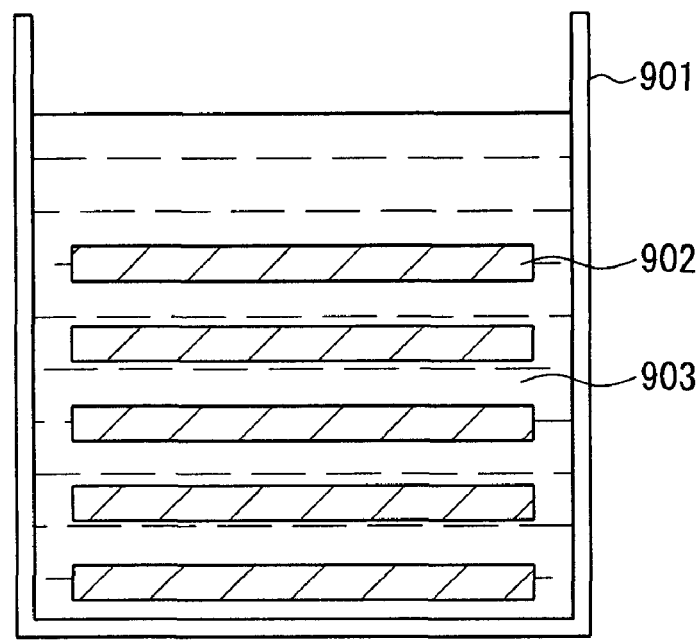
FIGS. 9A and 9B are schematic views showing an example of the processes of a conventional production method.
Figure 9B:
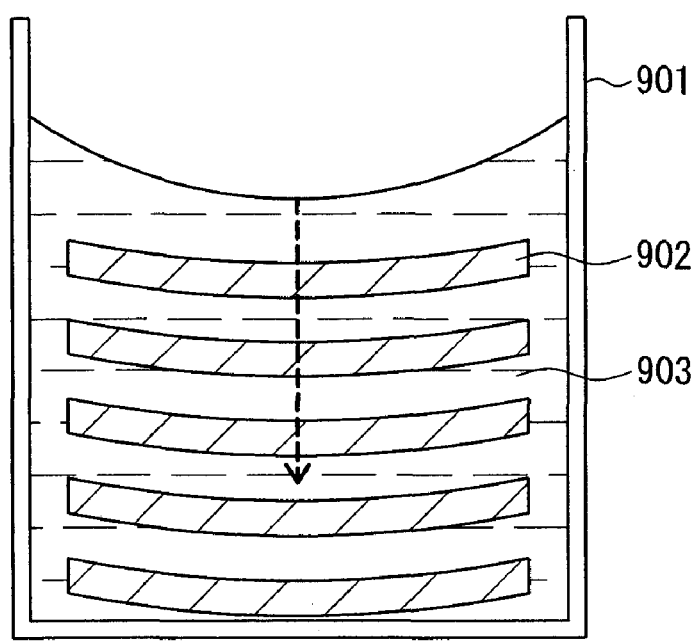

FIG. 9 shows a plurality of sheet templates 902 located parallel to the bottom of a crucible 901. FIG. 9A shows a material solution 903 and the sheet templates 902 in the crucible 901 during a growth process. FIG. 9B shows the material solution 903 and the sheet templates 902 in the crucible 901 after the growth process, followed by cooling the material solution 903. The material solution 903 including the alkali metal and the Group III element is coagulated and shrinks upon cooling. Therefore, the central portion of the material solution 903 is curved inward and causes stress on the sheet templates 902 in the direction of the arrow, as shown in FIG. 9B. This stress results in distortion of the substrates. If the stress is large, the substrates are cracked.

Based on the above results, as shown in FIG. 10, the present inventors studied placing a plurality of sheet templates 1003 substantially upright on the bottom of a crucible 1001.

Figure 10A:
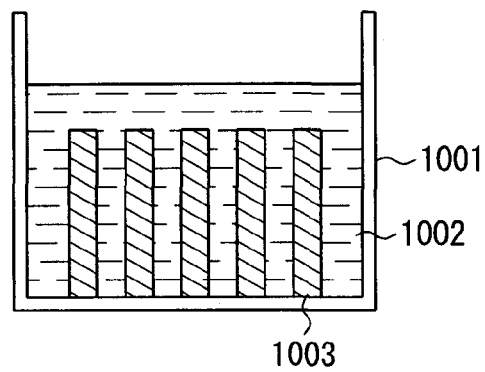
FIGS. 10A to 10D are schematic views showing yet another example of the processes of a production method of the present invention.

The crucible 1001 is set in the closed pressure- and heat-resistant container (not shown). Then, the closed pressure- and heat-resistant container is connected to the source gas supply unit, and the stop valve is opened to allow the source gas into the closed pressure- and heat-resistant container (not shown). A Group III element (material) and an alkali metal (flux) are placed in the crucible 1001. At the same time, a plurality of sheet templates 1003 are placed substantially upright on the bottom of the crucible 1001, as shown in FIG. 10A. FIG. 10A is a side view of the sheet templates 1003.

Figure 10B:
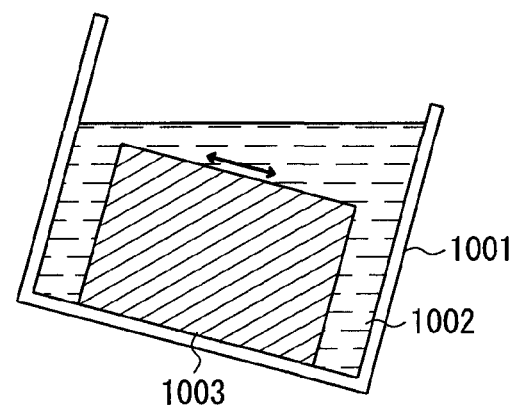
Figure 10C:
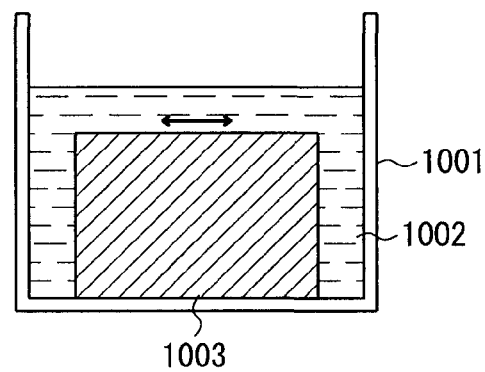
Figure 10D:
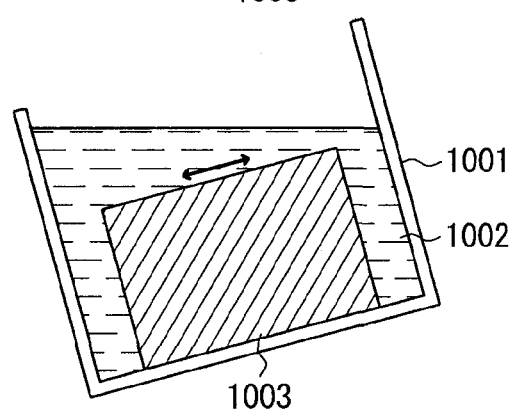

The closed pressure- and heat-resistant container is fixed in the heating unit (growth chamber) (not shown). After the desired growth temperature and pressure are set, the material solution is swayed and stirred by rocking the heating unit (growth chamber) and the crucible 1001 from side to side (FIGS. 10B to 10D). FIGS. 10B to 10D are front views of the sheet templates 1003.

As shown in FIGS. 10B to 10D, it is preferable that the closed pressure- and heat-resistant container is rocked so that the material solution moves parallel to the sheet templates. This can prevent the sheet templates from interfering with the stirring of the material solution, and also can form a flow of the material solution between the sheet templates. Thus, uniform crystal growth can be accelerated on the sheet templates simultaneously.

After the crystal growth at constant temperature and pressure for a predetermined time, the temperature is lowered to room temperature, and then the sheet templates are removed. Consequently, a Group III nitride single crystal is grown on the sheet templates, and neither crack nor fracture is observed in the sheet templates as well as the Group III nitride single crystal.

The alkali metal, e.g., sodium has a large difference (22%) in specific gravity between solid (970 kg/m$^3$) and liquid (760 kg/m$^3$, 800° C. (1073 K)), and therefore solidification shrinkage also is significant. For this reason, if the sheet templates are not placed substantially upright on the bottom of the crucible, they will be damaged because stress is applied to the sheet templates at the time of removal or cooling. Since nitrogen is dissolved due to the pressure from the gas-liquid interface, the sheet templates standing substantially upright also are effective to reduce a concentration distribution in the vertical direction. Moreover, the material solution with a uniform concentration can be formed by stirring it in the direction parallel to the sheet templates. Accordingly, the practical effects of placing the sheet templates substantially upright on the bottom of the crucible are significant in the production method in which nitrogen is dissolved under pressure in the material solution that includes the alkali metal and the Group III element, and a Group III nitride single crystal is grown in the material solution. The placement of the sheet templates is not critical to the present invention and may be selected arbitrarily.

Embodiment 2

In this embodiment, a closed pressure- and heat-resistant container can be separated from a connection pipe, and only the container is rocked. An example of a production apparatus of this embodiment and an example of a production method using the apparatus will be described in the following.

The production apparatus includes a source gas supply unit for supplying a source gas, a pressure regulator for regulating the pressure of a growth atmosphere, a closed pressure- and heat-resistant container for crystal growth, a heating unit (growth chamber), and a rotational mechanism for turning the closed pressure- and heat-resistant container. The closed pressure- and heat-resistant container is rotated by the rotational mechanism. When a crucible is inserted and fixed in the container, the crucible also can be rotated with the container. The rotational mechanism is attached to a connection pipe to turn the container alone. The material solution can be stirred efficiently, e.g., by reversing the rotation direction periodically, which enhances the dissolution of nitrogen in the material solution. A compound single crystal can be produced in the same manner as Embodiment 1 except that only the closed pressure- and heat-resistant container is turned. The material solution including the Group III element and the alkali metal also is stirred, e.g., by friction against the wall of the crucible.

Compared to the stirring process with a linear repetitive motion of the container in Embodiment 1, the stirring process with a rotational motion of the container in this embodiment can suppress nonuniform nucleation on the inner wall of the crucible. For the linear repetitive motion of Embodiment 1, the material solution does not always come into contact with the inner wall of the crucible. Therefore, the reaction with the source gas such as nitrogen becomes vigorous and promotes nonuniform nucleation. In contrast, the rotational motion of this embodiment allows the material solution always to be in contact with the inner wall of the crucible, so that nonuniform nucleation can be suppressed. In the production method of the present invention, nonuniform nucleation is likely to occur at the gas-liquid interface because the source gas is dissolved in the material solution from the gas-liquid interface. Thus, the material solution should be stirred to create a flow from the gas-liquid interface in contact with the source gas toward the inside of the material solution. FIG. 11 shows three examples of mechanisms for creating a flow in this embodiment.

In a mechanism as shown in FIG. 11A, a crucible 1101 is covered with a lid 1102, and an impeller 1103 hangs from the lid 1102. When the closed pressure- and heat-resistant container (not shown) and the crucible 1101 are rotated to cause convection in a material solution 1104 in the rotation direction, the impeller 1103 accelerates stirring further. In this case, a downward flow, i.e., a flow from the gas-liquid interface to the inside of the material solution 1104 is generated by the impeller 1103.

In a mechanism as shown in FIG. 11B, a baffle 1106 is put on the gas-liquid interface (the baffle 1106 may be integral with the crucible 1101). When the closed pressure- and heat-resistant container (not shown) and the crucible 1101 are rotated to cause convection in the material solution 1104 in the rotation direction, a flow from the gas-liquid interface to the inside of the material solution 1104 is generated by the baffle 1106.

In a mechanism as shown in FIG. 11C, helical protrusions 1107 are formed on the inner wall of the crucible 1101. When the closed pressure- and heat-resistant container (not shown) and the crucible 1101 are rotated to cause convection in the material solution 1104 in the rotation direction, a flow from the gas-liquid interface to the inside of the material solution 1104 is generated by the helical protrusions 1107.

As a device for rotating the closed pressure- and heat-resistant container, e.g., the rotational mechanism is attached to the connection pipe in this embodiment. However, the present invention is not limited thereto, and a rotational mechanism may be attached under the closed pressure- and heat-resistant container. In such a case, an auxiliary tank system for supplying the source gas also may be connected to the container. Moreover, a pressure regulator for regulating the pressure may be provided in the middle of a connection pipe that connects the container and the auxiliary tank system. The pressure in the auxiliary tank system is higher than that in the closed pressure- and heat-resistant container. Thus, the container can be refilled with the source gas after consumption.

Embodiment 3

In this embodiment, a source gas supply unit and a closed pressure- and heat-resistant container are connected by a flexible pipe, and the container is rocked without being separated from the source gas supply unit. An example of a production apparatus of this embodiment and an example of a production method using the apparatus will be described in the following.

The production apparatus includes a source gas supply unit for supplying a source gas, a pressure regulator for regulating the pressure of a growth atmosphere, a closed pressure- and heat-resistant container for crystal growth, a flexible pipe, a heating unit (growth chamber), and a rocking unit for rocking the whole heating unit (growth chamber). The source gas supply unit and the closed pressure- and heat-resistant container are connected by the flexible pipe, and therefore the material solution in a crucible can be stirred by rocking the whole heating unit (growth chamber) even if the container is not separated. A compound single crystal can be produced in the same manner as Embodiment 1 except that the closed pressure- and heat-resistant container is rocked without being separated from the source gas supply unit. In this case, since the container need not be separated from the source gas supply unit, crystal growth can be performed stably while maintaining the pressure in the container constant with the pressure regulator. Thus, it is possible to achieve a specific growth orientation and growth rate. As described above, the container may be separated from the source gas supply unit, sealed, and then rocked. The decision whether to separate the container from the source gas supply unit can be made arbitrarily.

In Embodiments 1 to 3, the connection pipe attached to the closed pressure- and heat-resistant container for supplying the source gas is located preferably outside the heating unit. This is because the stop valve, the pressure regulator, the flexible pipe, etc. have to be located outside the heating unit. When the material solution includes the alkali metal or alkaline-earth metal, the vapor pressure is increased at a high temperature of 700° C. (973 K) or more. Therefore, a temperature distribution develops in the closed pressure- and heat-resistant container and may cause aggregation of the material solution. To prevent such aggregation, the temperature of the container body is preferably maintained constant. However, if the connection pipe located outside the heating unit has an excessively large inner diameter, vapors of the material solution or flux material are transferred easily, aggregated in a low-temperature region of the connection pipe, and finally coagulated. This leads to a change in the flux ratio of the material solution and significantly affects the crystal growth. Moreover, if the connection pipe is clogged, it is impossible to refill the container with nitrogen during the growth process or to supply nitrogen through the flexible pipe, which also significantly affects the crystal growth. The inner diameter dependence of the connection pipe attached to the container for source gas supply was evaluated. Consequently, both aggregation and coagulation were likely to occur in the connection pipe with an inner diameter of 3 mm or more. The aggregation was suppressed considerably with an inner diameter of 3 mm or less, and hardly occurred with an inner diameter of 2 mm or less. Therefore, the inner diameter of the connection pipe is preferably 3 mm or less, and more preferably 2 mm or less. The flexible pipe, the connection pipe that connects the container and the auxiliary tank system, etc. may have the same diameter.

Embodiment 4

In this embodiment, a material solution including a flux material is drawn from a closed pressure- and heat-resistant container after the growth of a compound single crystal is finished. The present invention preferably includes injecting the flux material into the closed pressure- and heat-resistant container and extracting the material solution including the flux material from the container after the formation of a compound single crystal. This embodiment is not indispensable to the present invention and may be used arbitrarily. An example of a production method of this embodiment will be described in the following.

The flux material is injected through an injection pipe into a crucible that is set in the closed pressure- and heat-resistant container. A Group III element is put in the crucible beforehand. In this case, the atmosphere in the container preferably is replaced with nitrogen to prevent oxidation of the flux material. Subsequently, the closed pressure- and heat-resistant container is controlled to have a pressurized atmosphere, a material solution is formed by heating, and a single crystal is precipitated from the material solution that is supersaturated with a source gas.

After the growth of a compound single crystal is finished, the material solution is drawn from the crucible while controlling the temperature inside the heating unit (growth chamber) so that the material solution is not coagulated. The pressure of the closed pressure- and heat-resistant container is reduced, an extraction pipe is inserted into the material solution, and then pressure is applied to the container, thereby drawing the material solution through the extraction pipe. The material solution including sodium and gallium may be drawn, e.g., at 100° C. (373 K) or more, preferably 300° C. (573 K) or more, and further preferably 500° C. (773 K) or more.

This can prevent the single crystal produced from being damaged by coagulation and shrinkage of the material solution during cooling. The alkali metal such as sodium reacts with water vigorously, and thus should be treated with ethanol or the like. Therefore, it requires some time to take the single crystal out of the container. However, the removal of the material solution including sodium or the like with the extraction pipe also facilitates the process of taking out the single crystal.

Next, an example of drawing the material solution will be described in detail by referring to FIG. 7.

As shown in FIG. 7A, a Group III element (material) 701 and a template 702 are placed in a crucible 502. As shown in FIG. 7B, a liquid flux material 703 is injected from the outside. It is preferable that the temperature of an injection pipe 504 is maintained at the melting point of the flux material or higher, e.g., by winding a microheater (not shown) around the injection pipe 504.

As shown in FIG. 7C, a detachable portion 505 is connected to a source gas supply unit (not shown) to allow a source gas into a closed pressure- and heat-resistant container 501. A stop valve 503 is opened, and the source gas is supplied from the source gas supply unit to the closed pressure- and heat-resistant container 501. The container 501 is fixed in a heating unit (growth chamber) (not shown), the temperature is raised to the growth temperature, and the pressure is adjusted. After adjusting the pressure, the stop valve 503 is closed, and the detachable portion 505 is removed to separate the container 501.

After the growth of a compound single crystal is finished, a material solution 506 is drawn from the crucible 502. The temperature of the material solution 506 is lowered. The pressure of the closed pressure- and heat-resistant container 501 is reduced to maintain the material solution 506 in the molten state, an extraction pipe 507 is inserted into the material solution 506, and then pressure is applied in the container 501, thereby drawing the material solution 506 through the extraction pipe 507 (FIG. 7D).

A compound single crystal can be produced in the same manner as Embodiment 1 except that this embodiment performs injecting the flux material into the closed pressure- and heat-resistant container and extracting the material solution including the flux material from the container after the formation of a compound single crystal.

FIG. 1 is a schematic view showing an example of the configuration of a production apparatus of the present invention. The production apparatus includes a source gas supply unit 101, a pressure regulator 102, a closed pressure- and heat-resistant container 103, a growth chamber 104, and a rocking unit for rocking the whole growth chamber 104. A stop valve 105 and a leak valve 106 are attached downstream from the pressure regulator 102. A crucible 107 is set in the closed pressure- and heat-resistant container 103. A connection pipe 114 for supplying a source gas and the container 103 can be separated by a detachable portion 108. A stop valve 109 is attached above the container 103 via a connection portion 110. An electric furnace including a heat insulator 111 and a heater 112 is located in the growth chamber 104, and the temperature is controlled with a thermocouple 113. The closed pressure- and heat-resistant container 103 is fixed in the electric furnace, and the whole growth chamber 104 can be rocked in the direction of the arrow. In FIG. 1, reference numeral 115 denotes a connection pipe.

Figure 3:
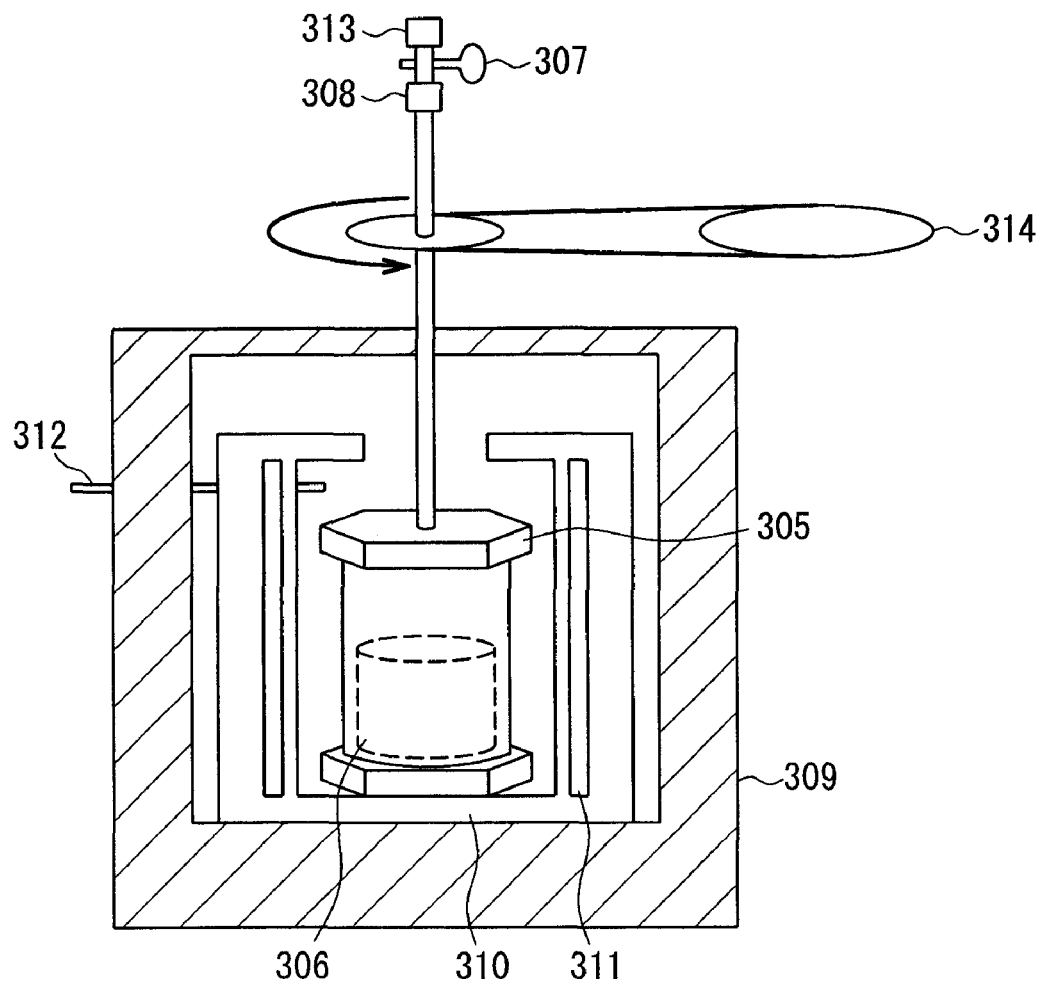
FIG. 3 is a schematic view showing another example of the configuration of a production apparatus of the present invention.

FIG. 3 is a schematic view showing another example of the configuration of a production apparatus of the present invention. As shown in FIG. 3, a crucible 306 is set in a closed pressure- and heat-resistant container 305. A connection pipe (not shown) for supplying a source gas and the container 305 can be separated by a detachable portion 313. A stop valve 307 is attached above the container 305 via a connection portion 308. An electric furnace including a heat insulator 310 and a heater 311 is located in a growth chamber 309, and the temperature is controlled with a thermocouple 312. A rotational mechanism 314 is attached to a connection pipe 315 and can rotate only the closed pressure- and heat-resistant container 305.

Figure 12:
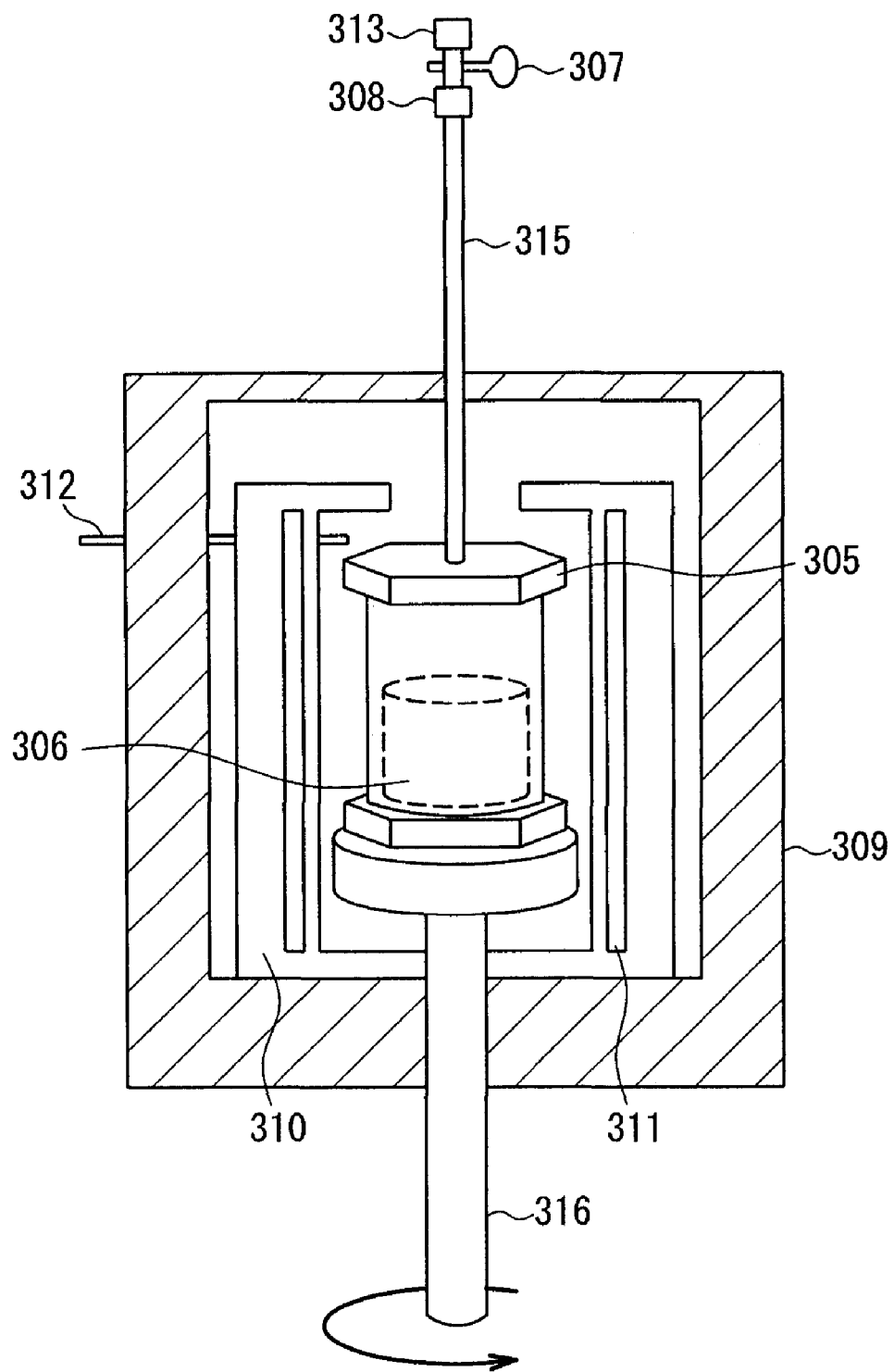
FIG. 12 is a schematic view showing still another example of the configuration of a production apparatus of the present invention.

FIG. 12 is a schematic view showing yet another example of the configuration of a production apparatus of the present invention. In FIG. 12, the same components as those in FIG. 3 are denoted by the same reference numerals. The production apparatus in FIG. 12 is the same as that in FIG. 3 except that a rotational mechanism 316 is attached under the closed pressure- and heat-resistant container 305 instead of the rotational mechanism 314 attached to the connection pipe 315.

Figure 13:
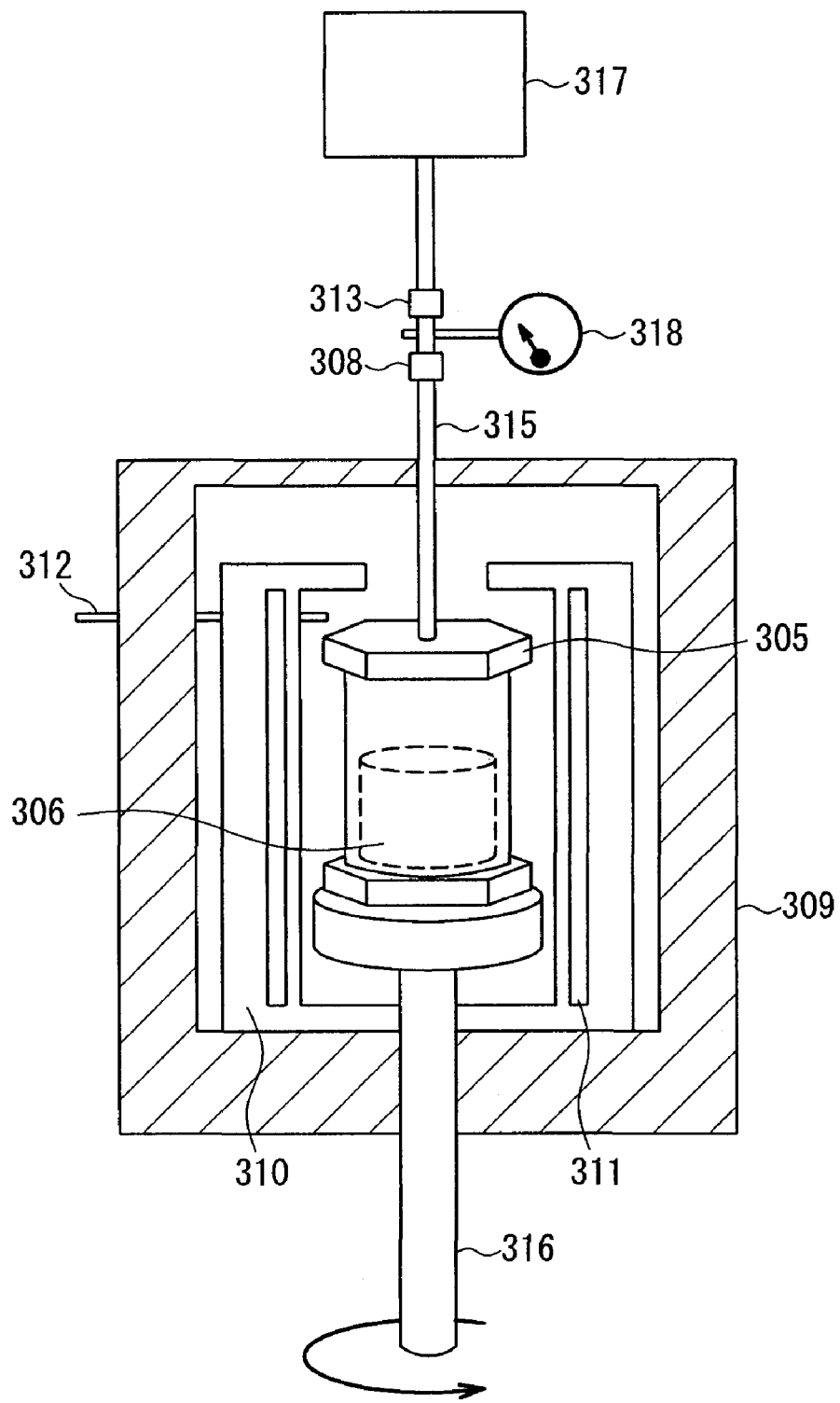
FIG. 13 is a schematic view showing still another example of the configuration of a production apparatus of the present invention.

FIG. 13 is a schematic view showing still another example of the configuration of a production apparatus of the present invention. In FIG. 13, the same components as those in FIG. 12 are denoted by the same reference numerals. The production apparatus in FIG. 13 is the same as that in FIG. 12 except that an auxiliary tank system 317 for supplying a source gas is connected to the closed pressure- and heat-resistant container 305, and a pressure regulator 318 instead of the stop valve 307 is attached via the connection portion 308.

Figure 14:
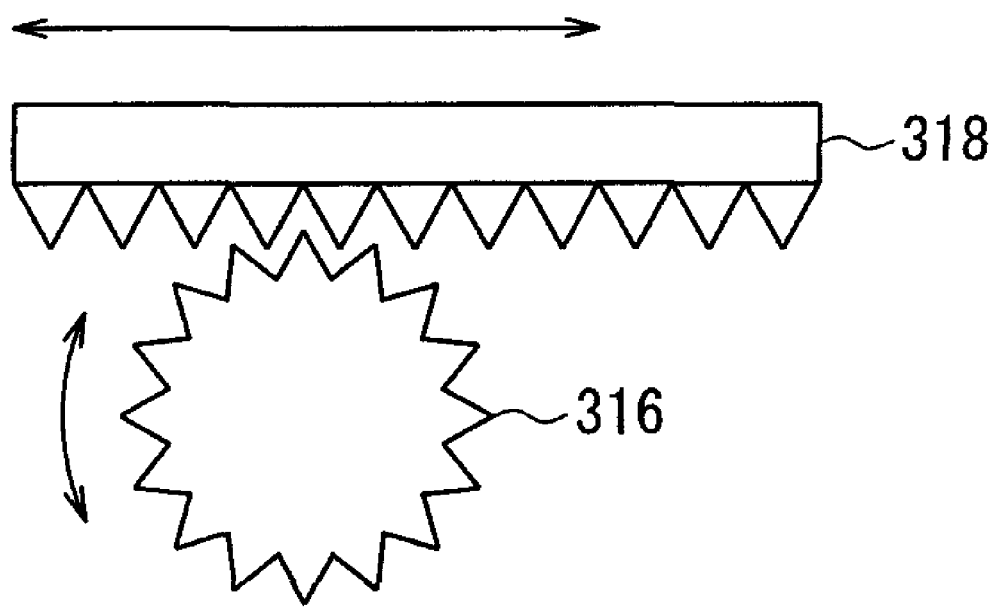
FIG. 14 is a schematic view showing an example of the configuration of a rotational mechanism of a closed pressure- and heat-resistant container of the present invention.

In the production apparatuses of FIGS. 12 and 13, the lower portion of a rotation axis of the rotational mechanism 316 is in the form of a cog, as shown in FIG. 14. By moving a corrugated plate 318 from side to side in the direction of the arrow, the linear repetitive motion can be converted into a rotational motion in which the rotation direction changes as indicated by the arrow. FIG. 14 is a schematic view of the rotation axis of the rotational mechanism 316 when viewed from underneath.

Figure 4:
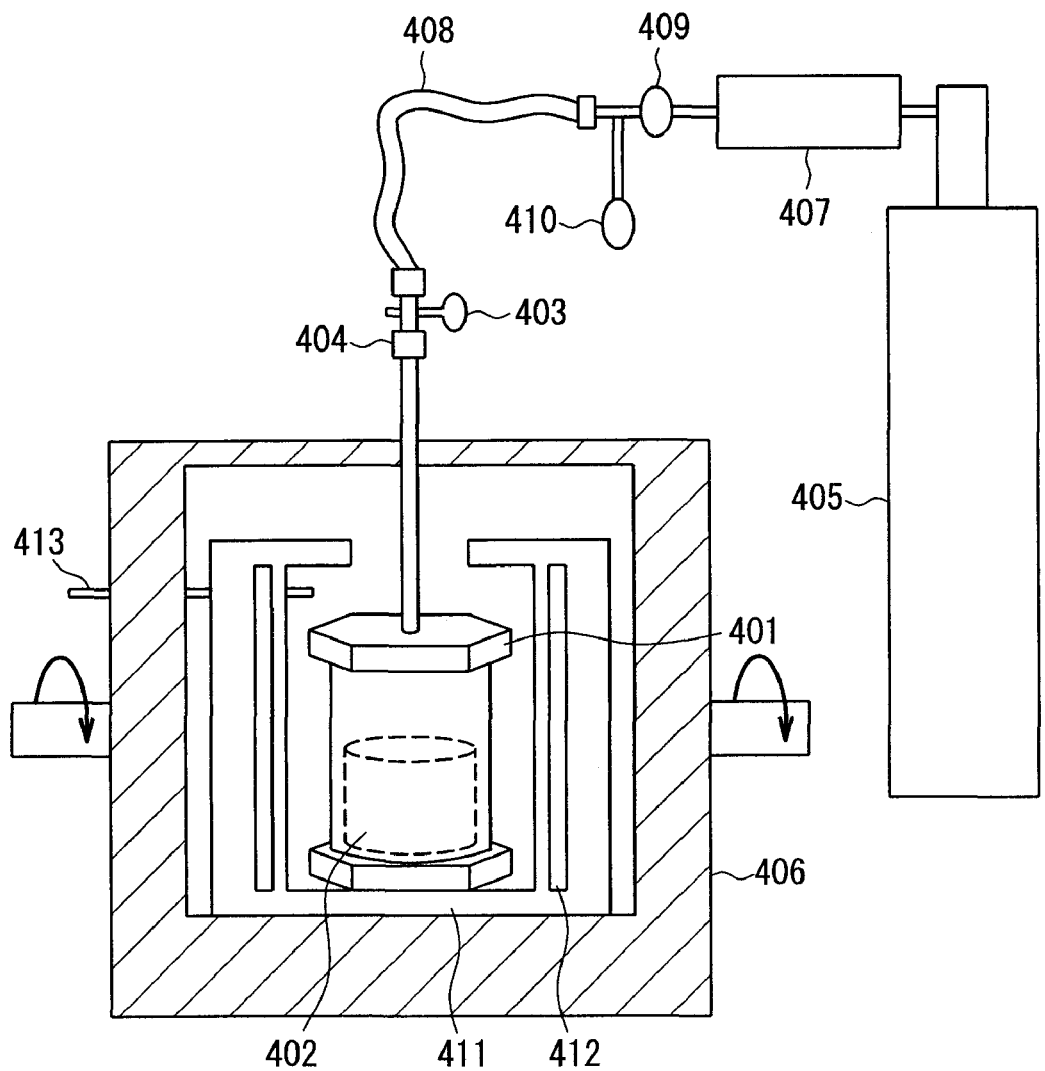
FIG. 4 is a schematic view showing yet another example of the configuration of a production apparatus of the present invention.

FIG. 4 is a schematic view showing still another example of the configuration of a production apparatus of the present invention. The production apparatus includes a source gas supply unit 405, a pressure regulator 407, a closed pressure- and heat-resistant container 401, a flexible pipe 408, a growth chamber 406, and a rocking unit for rocking the whole growth chamber 406. A stop valve 409 and a leak valve 410 are attached downstream from the pressure regulator 407. A crucible 402 is set in the closed pressure- and heat-resistant container 401. A stop valve 403 is attached above the container 401 via a connection portion 404. An electric furnace including a heat insulator 411 and a heater 412 is located in the growth chamber 406, and the temperature is controlled with a thermocouple 413. The closed pressure- and heat-resistant container 401 and the source gas supply unit 405 are connected by the flexible pipe 408. Therefore, the stop valve 403 may be either opened or closed. When the stop valve 403 is opened, the pressure in the container 401 can be maintained constant, resulting in stable crystal growth. The stop valve may be closed when nitrogen present in the container 401 is sufficient for the amount of the Group III element consumed. In such a case, even if leakage occurs while the source gas supply unit 405 is connected to a plurality of closed pressure- and heat-resistant containers, the other devices are not affected. Thus, a practical effect can be expected. The closed pressure- and heat-resistant container 401 is fixed in the electric furnace, and the whole growth chamber 406 can be rocked in the direction of the arrow. In FIG. 4, reference numeral 414 denotes a connection pipe.

Figure 5:
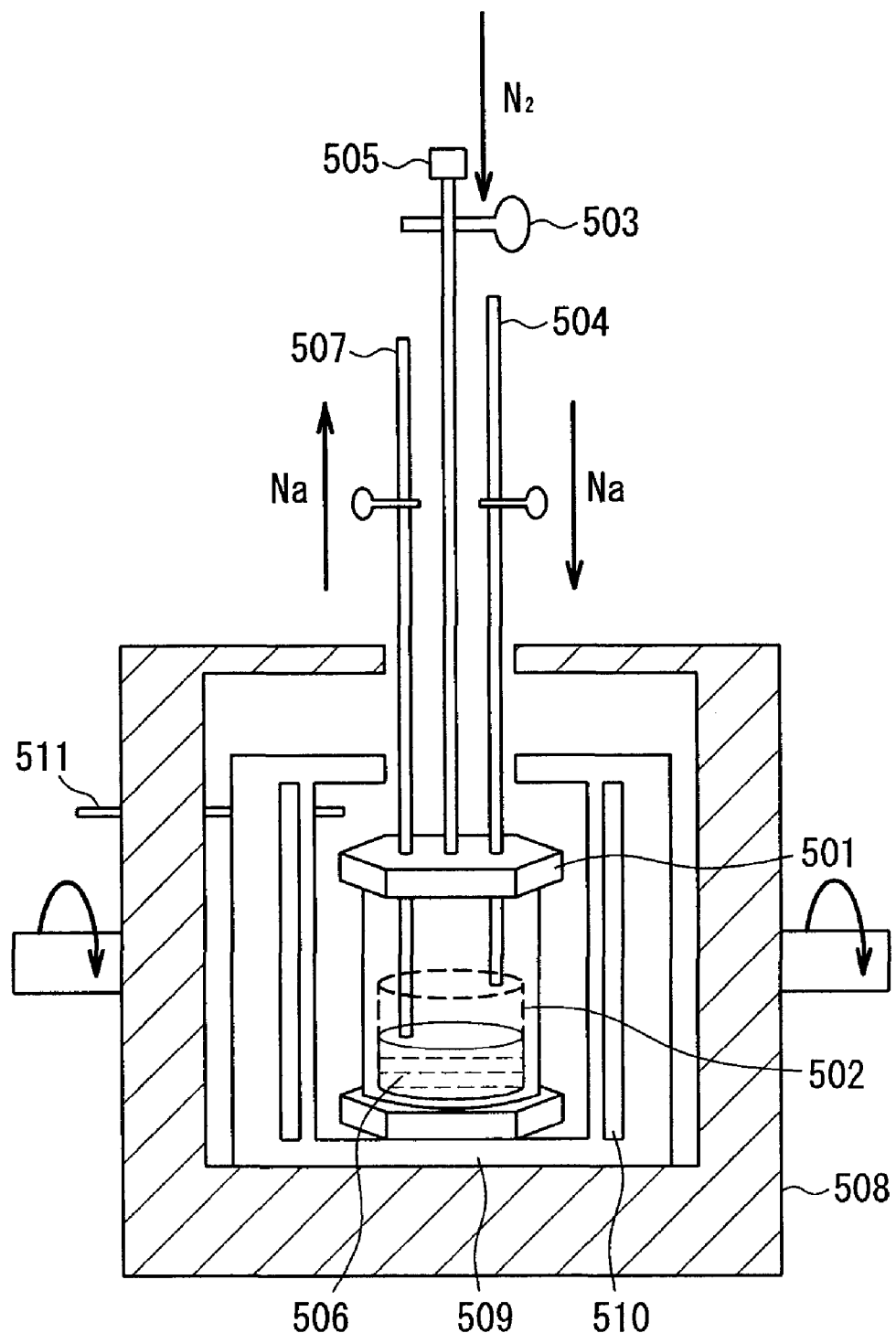
FIG. 5 is a schematic view showing still another example of the configuration of a production apparatus of the present invention.
Figure 6A:
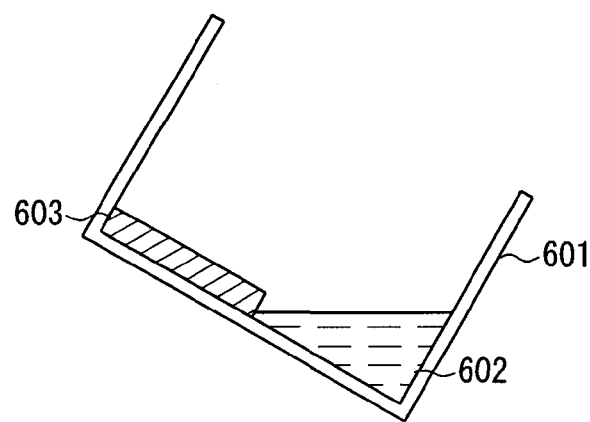
FIGS. 6A to 6D are schematic views showing an example of a stirring process of a material solution of the present invention.
Figure 6B:
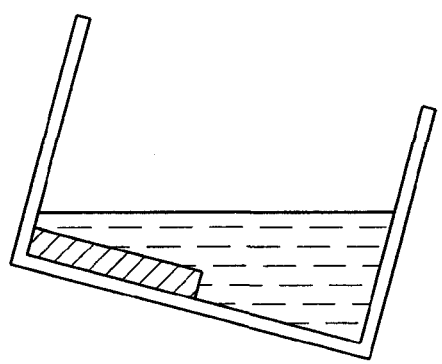
Figure 6C:
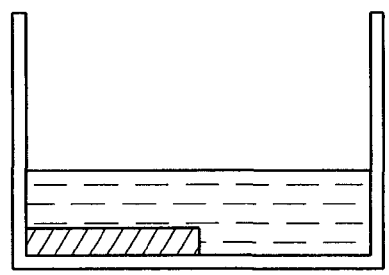
Figure 6D:
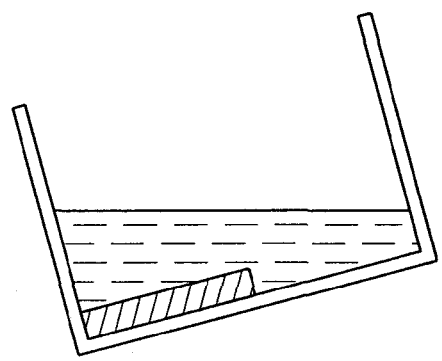

FIG. 5 is a schematic view showing still another example of the configuration of a production apparatus of the present invention. As shown in FIG. 5, a crucible 502 is set in a closed pressure- and heat-resistant container 501. An injection pipe 504 for a flux material and an extraction pipe 507 are attached to the closed pressure- and heat-resistant container 501. A connection pipe (not shown) for supplying a source gas and the container 501 can be separated by a detachable portion 505. A stop valve 503 is attached above the container 501. An electric furnace including a heat insulator 509 and a heater 510 is located in a growth chamber 508, and the temperature is controlled with a thermocouple 511. The closed pressure- and heat-resistant container 501 is fixed in the electric furnace, and the whole growth chamber 508 can be rocked in the direction of the arrow.

EXAMPLE 1

Using the production apparatus of FIG. 1, a Group III nitride single crystal was produced by the method as shown in FIG. 2. The closed pressure- and heat-resistant container 103 was a stainless steel container made of SUS316. The Group III element 201 was Ga (3 g), and the alkali metal 202 was Na (3 g). The template 203 was formed in such a manner that a GaN semiconductor layer was deposited on a sapphire substrate by heating the sapphire substrate at 1020° C. (1293 K) to 1100° C. (1373 K) and supplying trimethylgallium (TMG) and $NH_3$ on the substrate. The size of the template was 20 mm×20 mm. The pressure regulator 102 was set to 25 atm ($25 \times 1.01325 \times 10^5$ Pa), and a source gas was supplied from the source gas supply unit 101 to the stainless steel container 103. The source gas was nitrogen. In this example, the atmosphere in the electric furnace was nitrogen because SUS316 was used as a material for the closed pressure- and heat-resistant container 103. Therefore, the container 103 was hardly corroded even after the formation of a single crystal, and was able to be reused. The atmospheric gas may be other than nitrogen. For example, if it is an inert gas such as Ar, the closed pressure- and heat-resistant container can be less susceptible to corrosion.

The temperature was raised to the growth temperature at which the material solution was formed in the crucible. Then, the growth chamber 104 was rocked in the direction of the arrow, so that a single crystal of the Group III nitride semiconductor was produced. The growth temperature was 850° C. (1123 K), and the nitrogen ambient pressure was 50 atm ($60 \times 1.01325 \times 10^5$ Pa) at 850° C. (1123 K).

During the growth process, nitrogen was reinjected several times to prevent a decrease in pressure of the stainless steel container 103 due to the consumption of nitrogen. The rocking was halted temporarily after 10 hours from the beginning of the growth process, and the detachable portion 108 was connected to the source gas supply unit 101 to allow the source gas into the stainless steel container 103. The pressure in the stainless steel container 103 was adjusted to 50 atm ($60 \times 1.01325 \times 10^5$ Pa). Then, the detachable portion 108 was removed again, the rocking was restarted, and the growth process continued.

A 1 mm thick single crystal was grown for 30 hours. The material solution was stirred by rocking the crucible, and nitrogen was dissolved efficiently in the material solution. Therefore, the dissolution time of nitrogen was reduced to 10 hours or less, and a growth rate of 50 μm/hour was achieved.

EXAMPLE 2

In this example, the inner volume of the closed pressure- and heat-resistant container was changed, and the growth process continued while the container was separated from the source gas supply unit.

First, using a closed pressure- and heat-resistant container with an inner volume V of $7.5 \times 10^{-2}$ (liter), a Group III nitride single crystal was produced in the same manner as Example 1 except that the pressure in the container was not adjusted by reinjection of nitrogen during the growth process. A temperature T1 at which Ga and Na were weighed was 27° C. (300 K). In this case, $V \times (P/1.01325 \times 10^5) \times (T1/T) > (X/2a) \times 22.4 \times 2$ was satisfied (where $V=7.5 \times 10^{-2}$ (liter), T1=300 (K), the atomic weight a of gallium=69.723, and the ambient pressure P in the growth process=$50 \times 1.01325 \times 10^5$ (Pa), the growth temperature T=1123 (K), and the weight. X of gallium consumed=3 (g) according to Example 1). Based on the Boyle-Charles law, when the volume ($7.5 \times 10^{-2}$ liter) of nitrogen in the container during the growth process (50 atm, 1123 K) was expressed in terms of 1 atm and 300K, the resultant volume was about 1 liter. The amount of nitrogen required for consuming 3 g (0.043 mol) of Ga in the atmosphere of 1 atm and 300 K was about 0.5 liter ($22.4 \times (0.043/2) \times (300/273)=0.53$), given by Ga+½$N_2$→GaN. Therefore, about 50% of nitrogen in the container was consumed for reaction of the entire Ga (3 g), and the pressure in the container at 850° C. (1123 K) was about 25 atm ($25 \times 1.01325 \times 10^5$ Pa). Thus, the pressure variation was −50%. The pressure varied by 50% during the growth process, and the growth rate was reduced in the latter half of the growth period. However, compared to the conventional method in which the material solution is not stirred, uniform crystal growth and a high growth rate were achieved. Moreover, the container was small in size, so that the apparatus including the electric furnace became compact. In the relationship of $V \times (P/1.01325 \times 10^5) \times (T1/T) < (X/2a) \times 22.4 \times 2$, however, the pressure variation in the growth process was large, and the growth rate was only equal to or not more than that of a conventional growth process.

Next, using a closed pressure- and heat-resistant container with an inner volume V of 0.2 (liter), a Group III nitride single crystal was produced in the same manner as Example 1 except that the pressure in the container was not adjusted by reinjection of nitrogen during the growth process. A temperature T1 at which Ga and Na were weighed was 27° C. (300 K). In this case, $V \times (P/1.01325 \times 10^5) \times (T1/T) > (X/2a) \times 22.4 \times 5$ was satisfied (where V=0.2 (liter), T1=300 (K), the atomic weight a of gallium=69.723, and the ambient pressure P in the growth process=$50 \times 1.01325 \times 10^5$ (Pa), the growth temperature T=1123 (K), and the weight. X of gallium consumed=3 (g) according to Example 1). Based on the Boyle-Charles law, when the volume (0.2 liter) of nitrogen in the container during the growth process (60 atm, 1123 K) was expressed in terms of 1 atm and 300 K, the resultant volume was about 2.7 liter. As described above, the amount of nitrogen required for consuming 3 g (0.043 mol) of Ga in the atmosphere of 1 atm and 300 K was about 0.5 liter. Therefore, about 20% of nitrogen in the container was consumed for reaction of the entire Ga (3 g), and the pressure in the container at 850° C. (1123 K) was about 40 atm ($40 \times 1.01325 \times 10^5$ Pa). Thus, the pressure variation was −20%. Comparing 40 atm at the end of the growth process and 50 atm at the beginning of the growth process, not only a change in the amount of nitrogen dissolved, but also a change in growth rate was small, resulting in uniform crystal growth. Needless to say, when the growth process was finished with half (1.5 g) the consumption of Ga, the consumption of nitrogen also was reduced by half, and the pressure was about 45 atm after the growth process. Consequently, the pressure variation was even smaller (in this case, $V \times (P/1.01325 \times 10^5) \times (T1/T) > (X/2a) \times 22.4 \times 10$).

Next, using a closed pressure- and heat-resistant container with an inner volume V of 0.4 (liter), a Group III nitride single crystal was produced in the same manner as Example 1 except that the pressure in the container was not adjusted by reinjection of nitrogen during the growth process. A temperature T1 at which Ga and Na were weighed was 27° C. (300 K). In this case, $V \times (P/1.01325 \times 10^5) \times (T1/T) > (X/2a) \times 22.4 \times 10$ was satisfied (where V=0.4 (liter), T1=300 (K), the atomic weight a of gallium=69.723, and the ambient pressure P in the growth process=$50 \times 1.01325 \times 10^5$ (Pa), the growth temperature T=1123 (K), and the weight. X of gallium consumed=3 (g) according to Example 1). Based on the Boyle-Charles law, when the volume (0.4 liter) of nitrogen in the container during the growth process (60 atm, 1123 K) was expressed in terms of 1 atm and 300 K, the resultant volume was about 5.3 liter. As described above, the amount of nitrogen required for consuming 3 g (0.043 mol) of Ga in the atmosphere of 1 atm and 300 K was about 0.5 liter. Therefore, about 10% of nitrogen in the container was consumed for reaction of the entire Ga (3 g), and the pressure in the container at 850° C. (1123 K) was about 45 atm ($45 \times 1.01325 \times 10^5$ Pa). Thus, the pressure variation was 10%. This further reduced a change in the growth conditions.

Moreover, even if the container was separated from the source gas supply unit or the pipe connecting them was closed so as to set the inner volume of the container to satisfy $V \times (P/1.01325 \times 10^5) \times (T1/T) > (X/2a) \times 22.4 \times 10$ for the consumption of Ga, the pressure variation in the growth process was suppressed to about 10%. Accordingly, stable crystal growth was achieved.

EXAMPLE 3

Using the production apparatus of FIG. 3, a Group III nitride single crystal was produced. The production method was the same as Example 1 except for the following: the crucible 306 was made of W (tungsten); 5 g of Ga was used as a Group III element; 5 g of Na and 0.04 g of Li were used as alkali metals; the pressure regulator (not shown) was set to 10 atm ($10 \times 1.01325 \times 10^5$ Pa); a source gas was supplied from the source gas supply unit (not shown) to the stainless steel container 305; the growth temperature was 830° C. (1103 K); and the nitrogen ambient pressure was 20 atm ($20 \times 1.01325 \times 10^5$ Pa) at 830° C. (1103 K). In this example, only the stainless steel container 305 was rotated by the rotational mechanism 314 attached to the connection pipe 315.

A 2 mm thick single crystal was grown for 40 hours. The high-speed growth with a growth rate of 60 to 70 μm/hour was achieved.

The stainless steel container 305 was rotated more stably by using the production apparatus of FIG. 12 than that of FIG. 3. Since the stainless steel container 305 was secured firmly to the rotational mechanism 316, the reversal motion was performed easily. Moreover, it was possible to refill the container with the source gas after consumption by using the production apparatus of FIG. 13 instead of the production apparatus of FIG. 3.

In this example, nonuniform nucleation was likely to occur at the gas-liquid interface because the source gas was dissolved in the material solution under pressure. The purpose of stirring of the present invention is to stir the material solution to create a flow from the gas-liquid interface in contact with the source gas toward the inside of the material solution. Therefore, in order to stir the material solution efficiently by rotational motion, it is preferable that a mechanism for creating such a flow toward the inside of the material solution is provided in the container (i.e., the crucible) that holds the material solution.

For example, when the three mechanisms as shown in FIG. 11 were provided in the crucible, a flow was formed from the gas-liquid interface to the inside of the material solution. Thus, nonuniform nucleation at the gas-liquid interface was suppressed.

Specifically, a production apparatus that did not have the above mechanism caused nonuniform nucleation at both the gas-liquid interface and the inner wall of the crucible under the growth conditions of 850° C. and 50 atm ($50 \times 1.01325 \times 10^5$ Pa). In contrast, the production apparatus with the three mechanisms of FIG. 11 did not cause any nonuniform nucleation even under the growth conditions of 850° C. and 50 atm ($50 \times 1.01325 \times 10^5$ Pa), but exhibited a growth rate of 50 μm/hour or more.

EXAMPLE 4

Using the production apparatus of FIG. 4, a Group III nitride single crystal was produced. The production method was the same as Example 1 except for the following: the closed pressure- and heat-resistant container 401 was an Inconel container; the crucible 402 was made of alumina; 5 g of Ga was used as a Group III element; 5 g of Na was used as an alkali metal; 0.05 g of Ca was used as an alkaline-earth metal; the template included a 10 μm thick GaN semiconductor layer formed on a sapphire substrate; the growth temperature was 850° C. (1123 K); and the nitrogen ambient pressure was 20 atm ($20 \times 1.01325 \times 10^5$ Pa) at 850° C. (1123 K). In this example, the Inconel container 401 and the source gas supply unit 405 were connected by the flexible pipe 408 via the connection portion 404. The flexible pipe 408 was designed to adapt to 1000 atm ($1000 \times 1.01325 \times 10^5$ Pa). Therefore, even if the Inconel container 401 was not separated from the source gas supply unit 405 at the connection portion 404, crystal growth was performed by rocking the Inconel container 401.

A 2 mm thick single crystal was grown for 30 hours. The material solution was stirred by rocking the crucible, and nitrogen was dissolved efficiently in the material solution. Therefore, the dissolution time of nitrogen was reduced to 10 hours or less, and a growth rate of about 100 μm/hour was achieved. In this example, the atmosphere in the electric furnace was air because Inconel was used as a material for the closed pressure- and heat-resistant container. However, the container was hardly corroded. Preferably, if the atmosphere in the electric furnace is an inert gas, the number of times the container is recycled can be increased. When Hastelloy or Incoloy was used as an alternate material for the container and the atmosphere in the electric furnace was air, corrosion was hardly observed.

EXAMPLE 5

Using the production apparatus of FIG. 5, a Group III nitride single crystal was produced by the method as shown in FIG. 7. The closed pressure- and heat-resistance container 501 was a stainless steel container. The Group III element 701 was Ga. The template 702 included a AlN semiconductor layer formed on a sapphire substrate. The flux material 703 was sodium in the liquid state.

The temperature was raised to the growth temperature at which the material solution was formed in the crucible. Then, the growth chamber 508 was rocked in the direction of the arrow, so that a single crystal of the Group III nitride semiconductor was produced. After the growth of the single crystal was finished, the temperature of the material solution was lowered to 300° C. (573 K), and then the material solution was drawn. Thus, it was possible to avoid damage to the single crystal by alloying of the material solution during cooling.

EXAMPLE 6

Using the production apparatus of FIG. 4, a Group III nitride single crystal was produced by the method as shown in FIG. 10. The closed pressure- and heat-resistant container 401 was an stainless steel container. The crucible 402 (1001) was made of alumina. The Group III element was Ga (40 g), and the alkali metal was Na (50 g). The template 1003 included a 10 μm thick GaN semiconductor layer formed on a sapphire substrate. As shown in FIG. 10A, five templates 1003 were placed perpendicular to the bottom of the crucible 1001.

The temperature was raised to the growth temperature at which the material solution was formed in the crucible. Then, the growth chamber 406 was rocked in the direction of the arrow, so that a single crystal of the Group III nitride semiconductor was produced. The growth temperature was 850° C. (1123 K), and the nitrogen ambient pressure was 35 atm ($35 \times 1.01325 \times 10^5$ Pa) at 850° C. (1123 K).

After the crystal growth at constant temperature and pressure for 50 hours, the temperature was lowered to room temperature, and then the templates were removed. Consequently, a 2 mm thick GaN single crystal was grown on the templates, and neither crack nor fracture was observed in the templates as well as the GaN single crystal.

INDUSTRIAL APPLICABILITY

As described above, the present invention can facilitate stirring of the material solution, accelerate the dissolution of nitrogen, and thus provide a high-quality low-cost substrate.

The invention claimed is:

1. A method for producing a compound single crystal comprising:
    growing a compound single crystal by reacting a source gas with a material solution including other materials,
    wherein the source gas includes at least one of nitrogen and ammonia, and the other materials include at least one Group III element selected from the group consisting of gallium, aluminum, and indium and a flux material,
    wherein a template that comprises a semiconductor layer expressed as a composition formula $Al_uGa_yIn_{1-u-y}N$ ($0 \leq u \leq 1$, $0 \leq v \leq 1$, and $0 \leq u+v \leq 1$) is placed in the material solution beforehand, and
    wherein a Group III nitride single crystal is grown while stirring the material solution to create a flow from a gas-liquid interface in contact with the source gas toward an inside of the material solution.

2. The method according to claim 1, using a single crystal production apparatus comprising a heating unit and a closed pressure- and heat-resistant container that is heated inside the heating unit,
    wherein the source gas of the compound single crystal and other materials are provided to the container and sealed in a pressurized atmosphere,
    the container is housed in the heating unit,
    a material solution is prepared by heating the container in the heating unit so that the other materials melt into a liquid, and
    under these conditions, a single crystal is grown by reading the source gas with the material solution while the material solution is stirred.

3. The method according to claim 2, wherein the single crystal is grown by reacting the source gas with the material solution while the material solution is stirred by rocking the container.

4. The method according to claim 3, wherein the container is rocked by rocking the heating unit.

5. The method according to claim 2, wherein a crucible is set in the container, and at least one of an inside and an inner wall of the crucible has at least one selected from the group consisting of (A) impeller, (B) baffle, (C) template, and (D) helical protrusions.

6. The method according to claim 3, wherein the rocking is at least one selected from the group consisting of a shift motion, a linear repetitive motion, a pendular motion, a rotational motion, and a combined motion of any of these motions.

7. The method according to claim 2, wherein the other materials include a flux material.

8. The method according to claim 3, wherein the single crystal production apparatus further comprises a source gas supply unit,
    the source gas supply unit is connected to the container in which the other materials have been put, supplies the source gas to the container, and is separated from the container after supplying the source gas, and subsequently the container is rocked.

9. The method according to claim 8, wherein the source gas supply unit is separated from the container after heating the container so that the other materials melt into a liquid and adjusting a pressure in the container.

10. The method according to claim 2, wherein a pressure of the source gas in the container is reduced after formation of the single crystal.

11. The method according to claim 2, wherein the single crystal production apparatus further comprises an auxiliary tank system for supplying the source gas, and the auxiliary tank system is connected to the container.

12. The method according to claim 3, wherein the single crystal production apparatus further comprises a source gas supply unit, the source gas supply unit and the container are connected by a flexible pipe, and the container is rocked without being separated from the source gas supply unit.

13. The method according to claim 1, wherein the flux material includes at least one of an alkali metal and alkaline-earth metal.

14. The method according to claim 2, wherein the template that comprises a semiconductor layer expressed as a composition formula: $Al_uGa_vIn_{1-u-v}N$ ($0 \leq u \leq 1$, $0 \leq v \leq 1$, and $0 \leq u+v \leq 1$) is placed in the container beforehand.

15. The method according to claim 14, wherein the material solution is prepared by heating in the container, the source gas is dissolved in the material solution, and subsequently the template is immersed in the material solution.

16. The method according to claim 14, wherein a crucible is set in the container, and the template is a sheet template and placed substantially upright on a bottom of the crucible.

17. The method according to claim 16, wherein the container is rocked so that the material solution moves parallel to the sheet template.

18. The method according to claim 7, wherein at least the flux material is removed from the container after the growth of the compound single crystal is finished.

19. The method according to claim 18, wherein the material solution includes at least gallium and sodium, and a heating temperature of the material solution is 100° C. (373 K) or more.

20. The method according to claim 19, wherein the heating temperature is 300° C. (573 K) or more.

21. The method according to claim 19, wherein the heating temperature is 500° C. (773 K) or more.

22. The method according to claim 1, wherein a growth rate of the Group III nitride single crystal is 30 μm/hour or more.

23. The method according to claim 1, wherein a growth rate of the Group III nitride single crystal is 50 μm/hour or more.

24. The method according to claim 1, wherein a growth rate of the Group III nitride single crystal is 100 μm/hour or more.

25. The method according to claim 2, wherein a pressure of the source gas in the container is 5 atm ($5 \times 1.01325 \times 10^5$ Pa) to 1000 atm ($1000 \times 1.01325 \times 10^5$ Pa).

26. The method according to claim 2, wherein the heating unit is filled with an inert gas.

27. The method according to claim 2, wherein when the other materials include gallium, the following formula (1) is satisfied:

$$V \times (P/1.01325 \times 10^5) \times (T1/T) > (X/2a) \times 22.4 \times 2 \quad (1)$$

where X(g) is a weight of gallium to be consumed, a (=69.723) is an atomic weight of gallium, V(liter) is an internal volume of the container, P (Pa) is an ambient pressure during a growth process (formation of the single crystal), T (K) is a growth temperature, and T1(K) is a temperature at which the other materials are weighed.

28. The method according to claim 27, wherein the following formula (2) is satisfied instead of the formula (1):

$$V \times (P/1.01325 \times 10^5) \times (T1/T) > (X/2a) \times 22.4 \times 5 \quad (2).$$

29. The method according to claim 27, wherein the following formula (3) is satisfied instead of the formula (1):

$$V \times (P/1.01325 \times 10^5) \times (T1/T) > (X/2a) \times 22.4 \times 10 \quad (3).$$

30. The method according to claim 2, wherein the single crystal production apparatus comprises a pipe for connecting the container in the heating unit and the outside of the heating unit, and the pipe has a structure that is likely to prevent aggregation of at least one of the material solution and the other materials.

31. The method according to claim 30, wherein an inner diameter of the pipe is 3 mm or less.

32. The method according to claim 30, wherein an inner diameter of the pipe is 2 mm or less.

* * * * *